(12) United States Patent
Sarrafzadeh et al.

(10) Patent No.: US 11,705,319 B2
(45) Date of Patent: Jul. 18, 2023

(54) DISCHARGE CHAMBERS AND IONIZATION DEVICES, METHODS AND SYSTEMS USING THEM

(71) Applicant: PERKINELMER HEALTH SCIENCES CANADA, INC., Woodbridge (CA)

(72) Inventors: Mehrnaz Sarrafzadeh, Toronto (CA); Gholamreza Javahery, Kettleby (CA); Charles Jolliffe, Schomberg (CA); Lisa Cousins, Henderson, NV (US)

(73) Assignee: PerkinElmer Scientific Canada ULC, Woodbridge (CA)

( * ) Notice: Subject to any disclaimer, the term of this patent is extended or adjusted under 35 U.S.C. 154(b) by 0 days.

(21) Appl. No.: 17/340,041

(22) Filed: Jun. 6, 2021

(65) Prior Publication Data

US 2022/0102130 A1 Mar. 31, 2022

Related U.S. Application Data

(63) Continuation of application No. 16/408,680, filed on May 10, 2019, now Pat. No. 11,031,227.

(60) Provisional application No. 62/673,513, filed on May 18, 2018.

(51) Int. Cl.
*H01J 49/12* (2006.01)
*H01J 49/10* (2006.01)
*H01J 37/32* (2006.01)

(52) U.S. Cl.
CPC ...... *H01J 49/123* (2013.01); *H01J 37/32009* (2013.01); *H01J 49/107* (2013.01)

(58) Field of Classification Search
CPC .. H01J 49/123; H01J 49/145; H01J 37/32027; H01J 37/32009; H01J 27/10; H01J 27/20
USPC ........................................................ 250/288
See application file for complete search history.

(56) References Cited

U.S. PATENT DOCUMENTS

| 6,891,157 | B2 | 5/2005 | Bateman |
| 9,607,819 | B1 | 3/2017 | Nazarov |
| 2005/0121607 | A1* | 6/2005 | Miller ............... G01N 27/624 250/288 |
| 2012/0160997 | A1 | 6/2012 | Fink |
| 2012/0292526 | A1 | 11/2012 | Hiraoka |
| 2017/0069478 | A1 | 3/2017 | Brown |

FOREIGN PATENT DOCUMENTS

DE 10362062 B4 2/2008

OTHER PUBLICATIONS

ESSR and Search Report for EP19803397.9 dated Feb. 8, 2022.

* cited by examiner

*Primary Examiner* — Kiet T Nguyen
(74) *Attorney, Agent, or Firm* — Banner & Witcoff, Ltd.

(57) ABSTRACT

Certain configurations of plasma discharge chambers and plasma ionization sources comprising a plasma discharge chamber are described. In some examples, the discharge chamber comprises a conductive area and is configured to sustain a plasma discharge within the discharge chamber. In other examples, the discharge chamber comprises at least one inlet configured to receive a plasma gas and at least one outlet configured to provide ionized analyte from the discharge chamber. Systems and methods using the discharge chambers are also described.

20 Claims, 22 Drawing Sheets

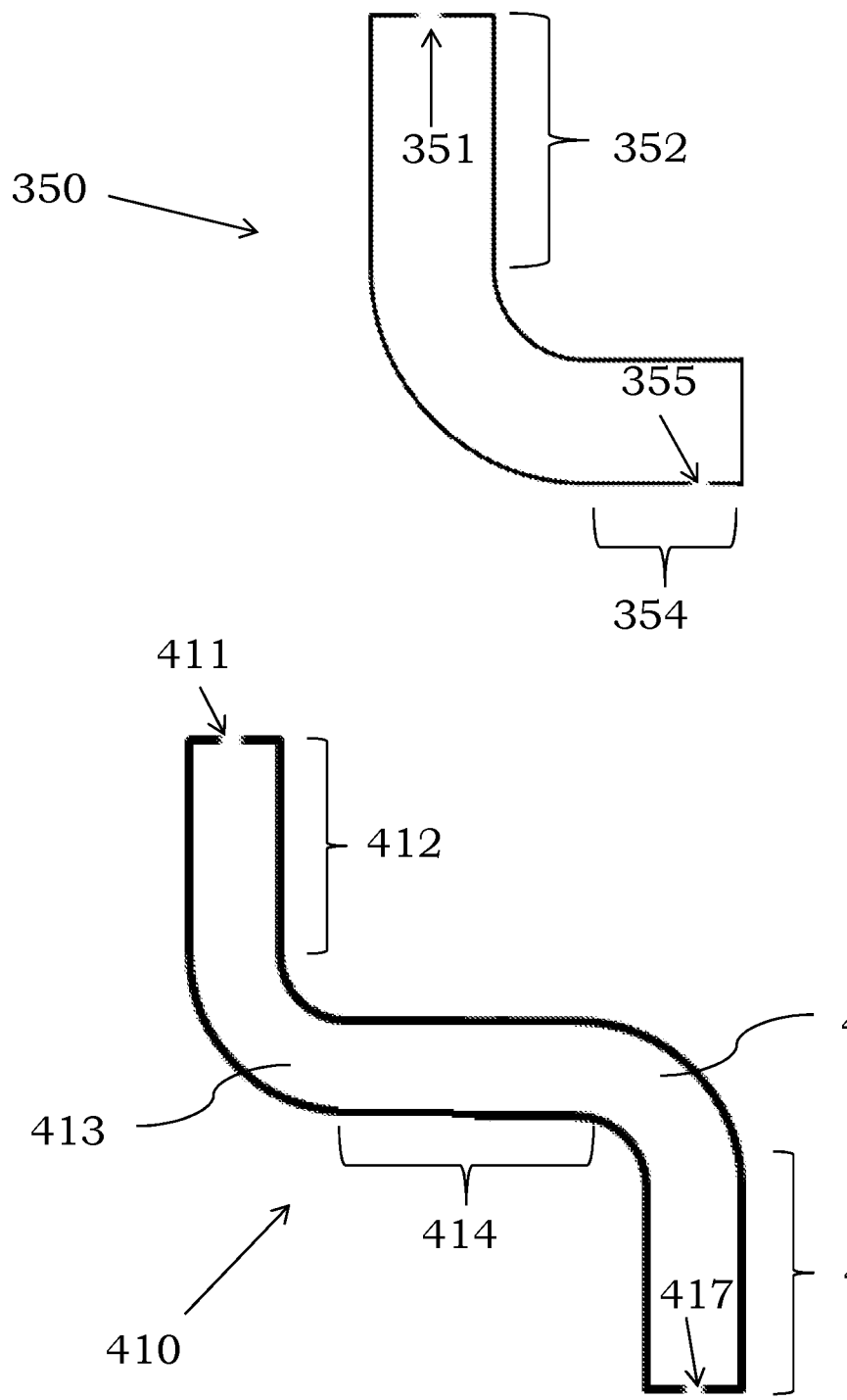

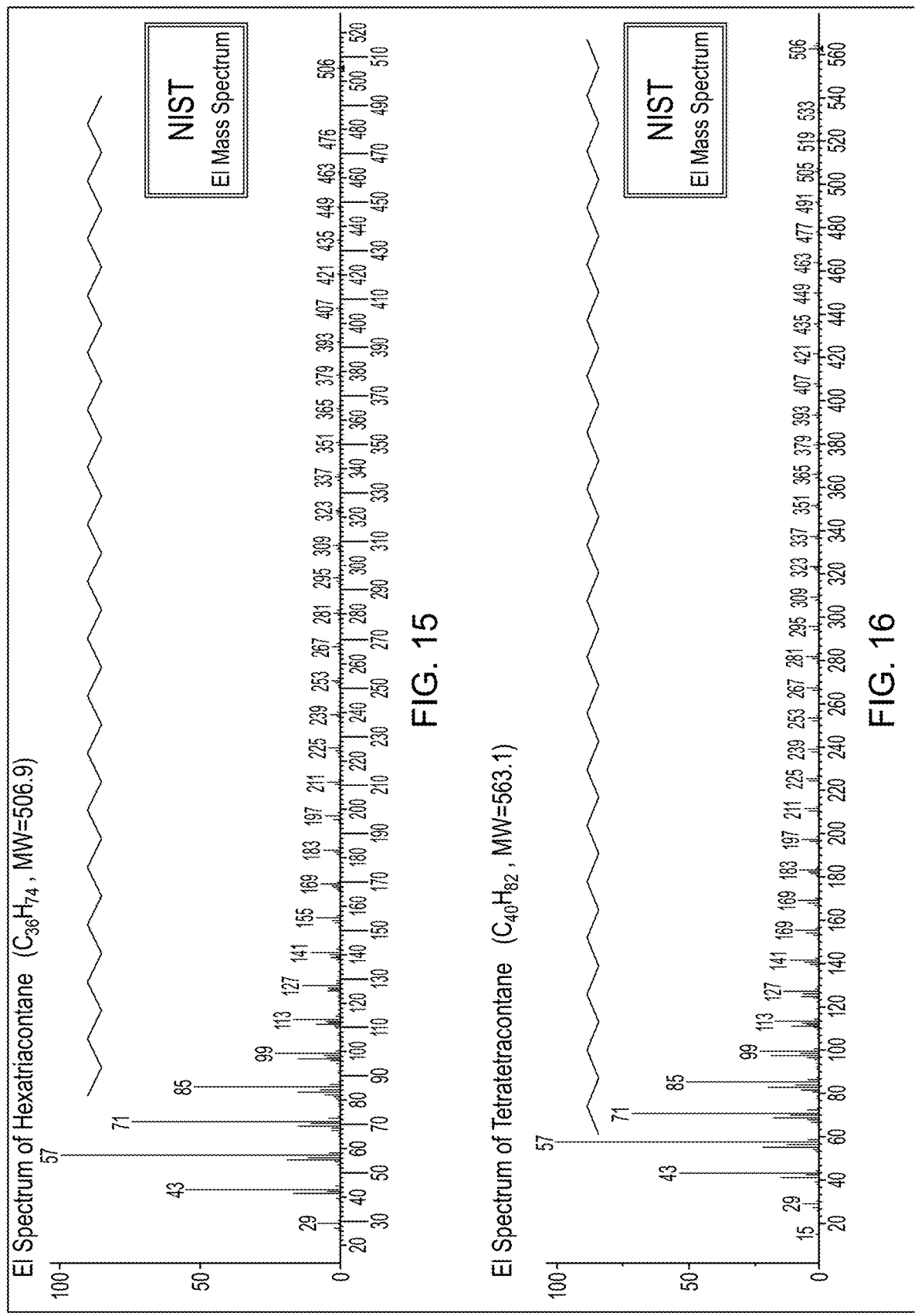

DISCHARGE CHAMBERS AND IONIZATION DEVICES, METHODS AND SYSTEMS USING THEM

PRIORITY APPLICATION

The application is a continuation of U.S. application Ser. No. 16/408,680 filed on May 10, 2019. U.S. application Ser. No. 16/408,680 is related to, and claims priority to and the benefit of, U.S. Provisional Application No. 62/673,513 filed on May 18, 2018, the entire disclosure of which is hereby incorporated herein by reference.

TECHNOLOGICAL FIELD

The technology described herein is related to ionization devices, methods and systems. More particularly, some configurations of plasma discharge ionization sources and systems and methods using them are discussed.

BACKGROUND

Ionization techniques are often used in the analysis of various analytes. Ionization of the analyte can often lead to extensive fragmentation.

SUMMARY

Certain aspects, embodiments, configurations and features of ionization devices, methods and systems are described herein.

In one aspect, a plasma discharge ionization source is provided. In certain configurations, the ionization source comprises a discharge chamber configured to electrically couple to a power source and configured to sustain a plasma discharge within the discharge chamber, wherein the discharge chamber comprises at least one inlet configured to receive a plasma gas, and at least one outlet configured to provide ionized analyte from the discharge chamber.

In certain examples, the plasma discharge ionization source further comprises at least one bend between the at least one inlet and the at least one outlet, and wherein the at least one bend is configured to reduce a number of metastable atoms and free electrons and photons exiting the discharge chamber through the at least one outlet. In some embodiments, the at least one bend is configured as bend of about ninety-degrees. In other embodiments, the plasma discharge ionization source further comprises a second bend positioned upstream of the at least one bend or positioned downstream of the at least one bend.

In some instances, the plasma discharge ionization source further comprises a first electrode electrically coupled to the discharge chamber, wherein the first electrode is configured to electrically couple to the power source. In other examples, the first electrode is positioned within the at least one inlet of the discharge chamber. In some embodiments, the plasma discharge ionization source further comprises a second electrode electrically coupled to the discharge chamber.

In some examples, the discharge chamber comprises one or more conductive materials, e.g., a stainless steel, tungsten, a nickel chromium alloy, nickel chromium molybdenum alloy, titanium, a titanium alloy and combinations thereof.

In certain embodiments, the inlet is configured to simultaneously receive the plasma gas and a sample comprising an analyte. In other embodiments, the plasma discharge ionization source further comprises a second inlet separate from the inlet, wherein the second inlet is configured to provide a sample comprising an analyte into the discharge chamber. In some examples, the discharge chamber comprises a first section adjacent to the at least one inlet, a third section adjacent to the at least one outlet and a second section between the first section and the third section.

In other examples, an average inner diameter of the third section is larger than an average inner diameter of the second section. In some embodiments, an average inner diameter of the second section is larger than an average inner diameter of the first section.

In other embodiments, the discharge chamber further comprises a second inlet configured to receive a second plasma gas. In certain examples, the discharge chamber is configured to sustain the plasma discharge without any inductive coupling.

In some configurations, the plasma discharge ionization source further comprises a second discharge chamber fluidically coupled to the discharge chamber, wherein the second discharge chamber comprises at least one bend between an inlet section and an outlet section of the second discharge chamber. In certain examples, the at least one bend of the second discharge chamber comprises a different geometry than the at least one bend of the discharge chamber.

In certain examples, the plasma discharge ionization source further comprises an electrode electrically coupled to the second discharge chamber. In some embodiments, the second discharge chamber is configured to sustain a plasma discharge with a second plasma gas different than the plasma gas. In certain examples, the discharge chamber can be configured to receive two or more different plasma gases to selectively ionize different analyte species using the different plasma gases.

In another aspect, a mass spectrometer system comprises a plasma discharge ionization source. The plasma discharge ionization source may comprise a discharge chamber configured to electrically couple to a power source, wherein the discharge chamber is configured to sustain a plasma discharge within the discharge chamber, and wherein the discharge chamber comprises at least one inlet configured to receive a plasma gas, and at least one outlet configured to provide ionized analyte from the discharge chamber. The mass spectrometer system may also comprise a mass analyzer fluidically coupled to the at least one outlet of the discharge chamber and configured to receive ionized analyte from the discharge chamber.

In certain examples, the discharge chamber further comprises a first electrode electrically coupled to the discharge chamber, wherein the first electrode is configured to electrically couple to the power source. In some examples, the discharge chamber is directly coupled to an inlet orifice of the mass analyzer.

In other examples, the mass analyzer comprises at least one quadrupole assembly fluidically coupled to the outlet of the discharge chamber. In some instances, the mass analyzer comprises a triple quadrupole assembly. In other instances, the mass spectrometer system comprises at least one pumping stage between the outlet of the discharge chamber and an inlet of the triple quadrupole assembly. In some examples, a first quadrupole assembly of the triple quadrupole assembly is fluidically coupled to the at least one pumping stage, and wherein the first quadrupole assembly is configured as a mass filter. In other instances, a second quadrupole assembly of the triple quadrupole assembly is fluidically coupled to the first quadrupole assembly, and wherein the second quadrupole assembly is configured as a collision quadrupole assembly. In some embodiments, a third quadrupole assembly of the triple quadrupole assembly is fluidically coupled to the second quadrupole assembly, and wherein the third quadrupole assembly is configured as a mass filter.

In some examples, the mass spectrometer system further comprises a detector fluidically coupled to the third quadrupole assembly. In certain embodiments, the mass spectrometer system further comprises a processor electrically coupled to the discharge chamber, wherein the processor is configured to provide a first voltage to the discharge chamber to sustain the plasma discharge within the discharge chamber. In some examples, the processor is configured to provide a second voltage, different than the first voltage, to sustain the plasma discharge within the discharge chamber. In some configurations, the processor is further configured to provide the plasma gas to the discharge chamber. In certain embodiments, the processor is further configured to provide a second plasma gas, different than the plasma gas, to the discharge chamber.

In certain embodiments, the discharge chamber of the mass spectrometer may comprise a first section adjacent to the at least one inlet, a third section adjacent to the at least one outlet and a second section between the first section and the third section. In other embodiments, an average inner diameter of the third section is larger than an average inner diameter of the second section, and wherein an average inner diameter of the second section is larger than an average inner diameter of the first section.

In some examples, the discharge chamber of the mass spectrometer further comprises at least one bend between the at least one inlet and the at least one outlet, and wherein the at least one bend is configured to reduce a number of metastable atoms and free electrons exiting the discharge chamber through the at least one outlet.

In certain examples, the mass spectrometer system further comprises a second discharge chamber fluidically coupled to the discharge chamber, wherein the second discharge chamber comprises at least one bend between an inlet section and an outlet section of the second discharge chamber.

In some embodiments, the mass spectrometer system further comprises a chromatography system fluidically coupled to the at least one inlet of the discharge chamber. In certain examples, the chromatography system is configured as a gas chromatography system or a liquid chromatography system.

In another aspect, a method comprises ionizing an analyte by introducing the analyte into a plasma discharge sustained within a discharge chamber comprising a first electrode, wherein the discharge chamber comprises at least one inlet and at least one outlet, and wherein the plasma discharge is sustained within the discharge chamber by providing a voltage to the first electrode in the presence of a plasma gas introduced into the discharge chamber through the at least one inlet of the discharge chamber.

In certain embodiments, the method comprises configuring the first electrode to be positioned within the at least one inlet of the discharge chamber. In some examples, the method comprises providing a direct current voltage of about +/−10 Volts to about +/−5000 Volts to the first electrode. In other examples, the method comprises providing an alternating current voltage of about +/−20 Volts to about +/−3000 Volts to the first electrode. In some instances, the method comprises providing a radio frequency current to the first electrode, wherein a frequency of the radio frequency is about 100 Hz to about 10 MHz. The voltages and frequencies provided herein are merely illustrative, and other voltages and frequencies will be selected by the person of ordinary skill in the art, given the benefit of this disclosure.

In other examples, the method comprises sustaining the plasma discharge within the discharge chamber at a suitable pressure to sustain the plasma discharge, e.g., one example may use a pressure of about $10^{-3}$-100 Torr. In some embodiments, the method comprises providing the plasma discharge using a plasma gas flow rate of 500 sccm or less, though flow rates other than this exemplary flow rate may also be used.

In some examples, the method comprises configuring the discharge chamber with a first section adjacent to the at least one inlet, a third section adjacent to the at least one outlet and a second section between the first section and the third section, wherein an average inner diameter of the third section is larger than an average inner diameter of the second section.

In certain examples, the method comprises selecting the provided voltage to promote production of a parent analyte ion of the ionized analyte to permit quantitation of the analyte using a parent analyte ion mass-to-charge peak intensity.

In some embodiments, the method comprises monitoring a current provided to the first electrode to determine if the plasma discharge is sustained within the discharge chamber. In certain examples, the method comprises using an optical sensor to determine if the plasma discharge is sustained within the discharge chamber.

In some configurations, the plasma gas can be one or more of helium, neon, argon, krypton, xenon, nitrogen, nitric oxide, ammonia, oxygen, air, compressed air, hydrogen, methane, carbon monoxide, carbon dioxide, nitrous oxide, and nitrogen dioxide. These illustrative plasma gases are provided as exemplary and not intended to exclude other plasma gases that might also be used, e.g., rare earth gases, rare earth gas mixtures, etc.

In certain examples, the method comprises introducing the analyte into the discharge chamber to ionize the introduced analyte using a first plasma gas, permitting the ionized analyte to exit the discharge chamber through the at least one outlet prior to introduction of a second analyte into the discharge chamber, and introducing the second analyte into the discharge chamber to ionize the introduced second analyte using a second plasma gas different from the first plasma gas. In some instances, the method comprises permitting the ionized second analyte to exit the discharge chamber through the at least one outlet prior to introduction of a third analyte into the discharge chamber, and introducing the third analyte into the discharge chamber to ionize the introduced third analyte using a third plasma gas different from the first plasma gas and the second plasma gas. Each of the first and second plasma gas can independently be one or more of helium, neon, argon, krypton, xenon, nitrogen, nitric oxide, ammonia, oxygen, air, compressed air, hydrogen, methane, carbon monoxide, carbon dioxide, nitrous oxide, and nitrogen dioxide.

In certain examples, the method comprises introducing the analyte into the discharge chamber to ionize the introduced analyte using a first voltage provided to the at least one electrode, permitting the ionized analyte to exit the discharge chamber through the at least one outlet prior to introduction of a second analyte into the discharge chamber, and introducing the second analyte into the discharge chamber to ionize the introduced second analyte using a second voltage different from the first voltage. In some embodiments, the method comprises permitting the ionized second analyte to exit the discharge chamber through the at least one outlet prior to introduction of a third analyte into the discharge chamber, and introducing the third analyte into the discharge chamber to ionize the introduced third analyte using a third voltage different from the first voltage and the second voltage. In some examples, the method comprises altering a composition of the plasma gas prior to introduction of the second analyte into the discharge chamber.

In other embodiments, the method comprises configuring the discharge chamber to comprise and at least one bend between the at least one inlet and the at least one outlet.

In some examples, the method comprises coupling the discharge chamber to a second discharge chamber, wherein the second discharge chamber is electrically coupled to a second electrode, wherein the second discharge chamber comprises at least one inlet, and at least one outlet, and wherein a plasma discharge is sustained within the second discharge chamber by providing a voltage to the second electrode in the presence of a plasma gas. In some configurations, the second discharge chamber can be configured with at least one bend between the at least one inlet of the second discharge chamber and the at least one outlet of the second discharge chamber. The methods described herein can be used to sustain the plasma discharge in the discharge chamber without any inductive coupling.

In an additional aspect, a kit is provided that comprises one or more of the plasma discharge ionization sources described herein and instructions for using the plasma discharge ionization source provide a plasma discharge within the discharge chamber.

In another aspect, a method of facilitating ionization of an analyte is described. In some examples, the method comprises providing a discharge chamber configured to sustain a plasma discharge within the discharge chamber, the discharge chamber configured to electrically couple to at least one electrode configured to couple to a power source, the discharge chamber further comprising at least one inlet and at least one outlet, and wherein the discharge chamber is configured to sustain the plasma discharge within the discharge chamber using a voltage provided to the at least one electrode.

In an additional aspect, a method of facilitating ionization of an analyte comprises providing a discharge chamber configured to sustain a plasma discharge within the discharge chamber, wherein the discharge chamber is configured to electrically couple to at least one electrode configured to couple to a power source. The discharge chamber may further comprise at least one inlet, at least one outlet and optionally at least one bend between the at least one inlet and the at least one outlet. The discharge chamber can be configured to sustain the plasma discharge within the discharge chamber using a voltage provided to the at least one electrode.

In another aspect, a method of quantitating an analyte in a sample comprises measuring a peak intensity of a parent analyte ion produced from ionization of the analyte after introducing the analyte into a plasma discharge produced within a discharge chamber by using a plasma gas flow rate of 500 sccm or less. In some examples, the plasma gas can be selected to enhance production of the parent analyte ion using the produced plasma discharge.

In an additional aspect, a method of ionizing of an analyte to enhance production of a parent analyte ion comprises introducing the analyte into a plasma discharge sustained in a discharge chamber using a plasma gas provided to the discharge chamber and a voltage provided to the discharge chamber. In some configurations, the plasma discharge can be sustained within the discharge chamber using a plasma gas flow of 500 sccm or less. In some instances, the plasma discharge comprises an average temperature of about 2000 Kelvin or less.

In another aspect, a plasma discharge comprising an average temperature of about 2000 Kelvin or less is described. In some embodiments, the plasma discharge can be sustained within a discharge chamber using a voltage provided to the discharge chamber in the presence of a provided plasma gas at a plasma gas flow rate of 500 sccm or less.

In another aspect, a plasma discharge is provided that is configured to provide both positive and negative analyte ions without altering a voltage provided to sustain the plasma discharge.

Additional aspects, configurations, embodiments and examples are described in more detail below.

BRIEF DESCRIPTION OF THE SEVERAL VIEWS OF THE DRAWINGS

Certain specific configurations of devices, systems and methods are described below with reference to the accompanying figures in which:

FIG. 3B is an illustration showing a discharge chamber comprising a soft bend, in accordance with some embodiments;

FIG. 4A is an illustration of a discharge chamber comprising two bends, in accordance with certain examples;

FIG. 15, FIG. 16, and FIG. 17 show mass spectra of different molecules, in accordance with certain embodiments.

Figure 1:
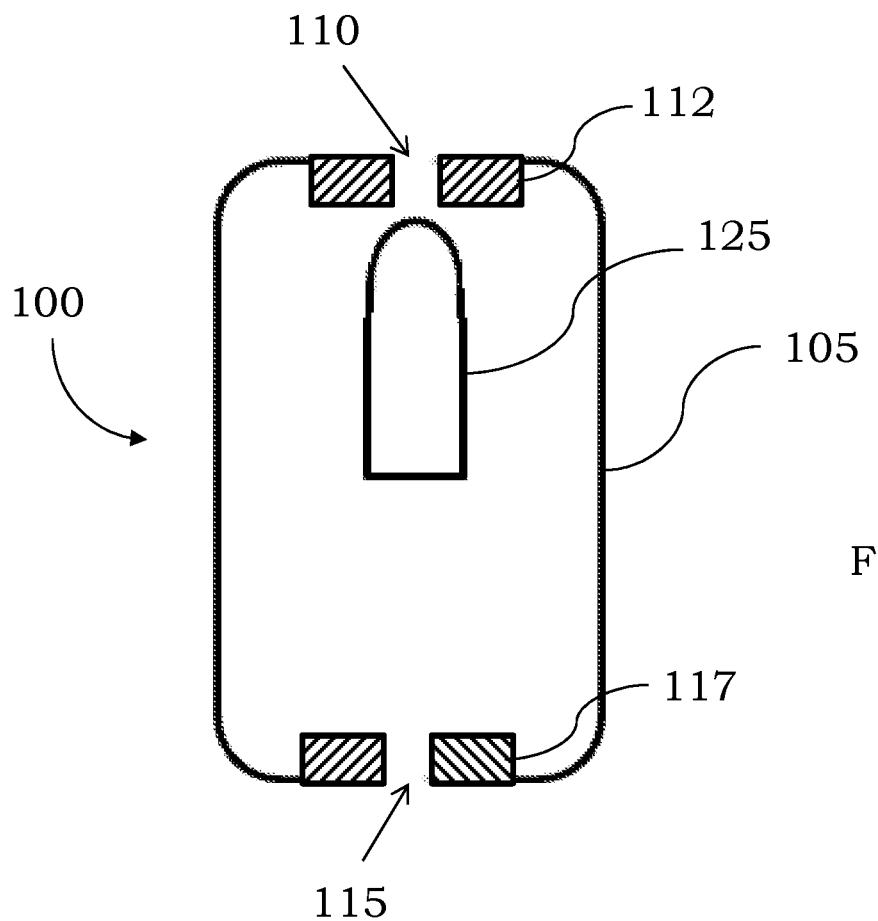
FIG. 1 is one illustration of a discharge chamber or tube configured to sustain a discharge ionization source, in accordance with certain examples.

It will be recognized by the person of ordinary skill in the art, given the benefit of this disclosure, that the lengths, widths and other dimensions of the discharge chambers are not necessarily to scale. The length or width of any one region may vary or be different than the length or width of any other region. Further, the three-dimensional shape of any one region may be different than other regions and may not necessarily be depicted in the two-dimensional figures shown.

DETAILED DESCRIPTION

Certain methods, devices and systems are described herein which are directed to ionization devices and systems that may more gently ionize one or more analytes. For example, conventional electron ionization (EI) sources can use very high energy to cause molecules to undergo extensive fragmentation. Extensive fragmentation of a molecule into daughter ions can result in overlap of different analyte fragments rendering it difficult to determine the identity and/or amount of the original molecule in a sample. By selecting the ionization device and the ionization conditions using the methods and devices described herein, softer ionization can be implemented to produce more precursor or parent ions, e.g., intact molecular ions without extensive fragmentation. The presence of enhanced levels of the precursor ions can provide certain attributes including, but not limited to, more accurate identification of the molecules in unknown samples and increased precision in quantifying an amount of each molecule present in an unknown sample.

Various discharge "tubes" or chambers are described to illustrate some of the many different configurations that can be used to provide softer ionization of molecules. The exact dimensions, materials and shapes of the tubes may vary. In some examples, the tube may be a "straight" tube, e.g., generally coaxial without any substantial bends, whereas in other instances the tube may be bent, e.g., comprise one or more bends. The internal diameter of the chamber or tube may increase or decrease from an inlet end to an outlet end as desired. Further, an increase in diameter in one portion of the chamber or tube could be followed by a decrease in diameter in another portion of the tube. The chambers or tubes may be optically transparent, optically opaque or comprise one or more optical windows to permit visualization of a plasma discharge within the tube. Both positive and negative ions can be produced using the chambers or tubes without needing to alter the voltages provided to sustain the plasma discharge. The chamber or tube may comprise one, two or more inlets and one, two or more outlets. As noted in more detail below, one or more portions of the chamber or tube may be conductive, but the entire chamber or tube need not be conductive and different conductive portions of the chamber or tube can be separated by non-conductive areas as desired. The discharge chamber can be configured to sustain a plasma discharge using a voltage and a plasma gas, e.g., by providing a voltage to some portion of the discharge chamber or an electrode used with the discharge chamber. The plasma discharge can be sustained, for example, without any inductive coupling.

In certain examples and referring to FIG. 1, a straight chamber or tube 100 is shown comprising a body 105, an inlet 110 and an outlet 115. The chamber 100 comprises a conductive area 112 adjacent to the inlet 110 and a conductive area 117 adjacent to the outlet 115. A voltage can be provided to the conductive area 112 and the conductive area 117 may be electrically coupled to ground. As a plasma gas is introduced into the chamber 100 through the inlet 110, a plasma discharge 125 can be sustained within the chamber 100. Depending on the plasma gas used, the discharge 125 can produce metastable atoms and ions. As an analyte is introduced into the chamber 100, the analyte molecules can collide with the electrons, metastable atoms and ions and form analyte ions, for example, by electron impact, penning ionization and/or charge transfer. The flow of plasma gas from the inlet 110 to the outlet 115 can transport the analyte ions down the chamber 100 and avoid their loss as a result of collision with the sides of the chamber 100. Metastable atoms and free electrons may impact the walls, be redirected or be removed using other means so they do not enter into a downstream component of the system to any substantial degree. A difference between the ionization potential of the plasma gas and the analyte generally defines the sensitivity of ionization as well as degree of fragmentation. By selecting the particular plasma gas used, selective ionization can be achieved for different analytes.

Figure 2A:
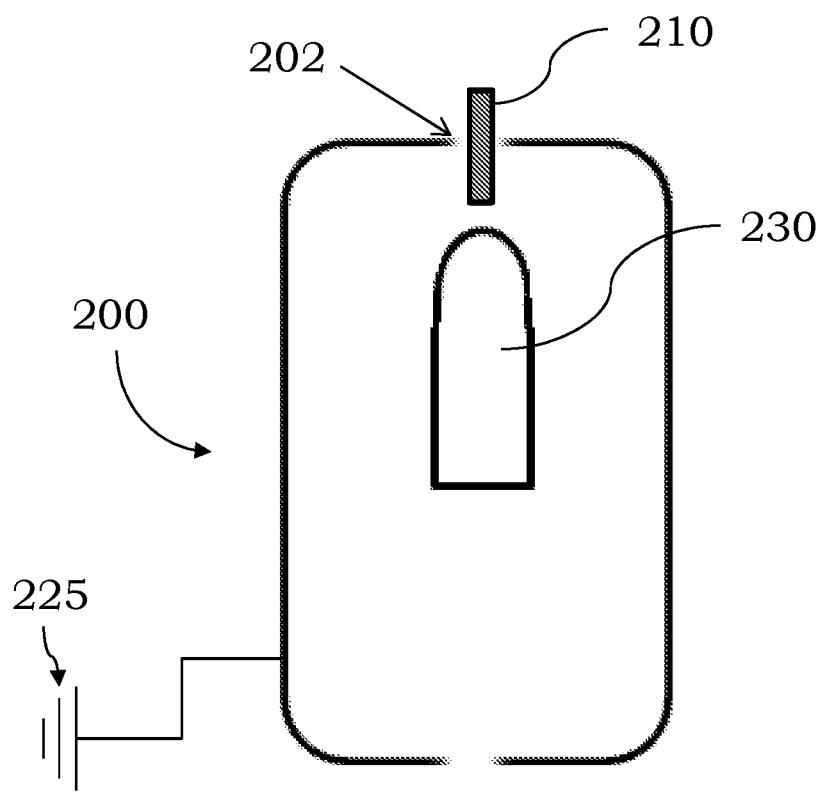
FIG. 2A is an illustration showing an electrode positioned within an inlet of a discharge chamber, in accordance with certain embodiments.

In some embodiments and referring to FIG. 2A, the discharge chamber or tube may be rendered conductive by electrically coupling an electrode to the inlet end of the chamber. The discharge chamber 200 comprises some portion of area which is conductive. An electrode 210 is shown as being coupled to an inlet 202 of the discharge chamber 200 by way of a probe, which can act to electrically isolate the electrode 210 from the discharge chamber 200. The discharge chamber 200 can be electrically coupled to chassis ground or ground 225. When a voltage is provided to the electrode 210 in the presence of a plasma gas, a plasma discharge 230 can be sustained within some portion of the chamber 200. Depending on the voltage provided and/or the provided plasma gas, the ionization potential of the plasma discharge 230 may be tuned or varied. This tuning provides a more controlled way to ionize molecules introduced into the chamber 200, and different analyte molecules may be introduced into a plasma discharge sustained with different plasma gases to alter the overall type and nature of ions produced from the analyte molecules. The exact dimensions of the electrode may vary depending on the dimensions of the inlet. For example, an electrode with a diameter of about 1-3 mm may be used, though the size may be smaller or larger depending on the dimensions of the discharge chamber.

Figure 2B:
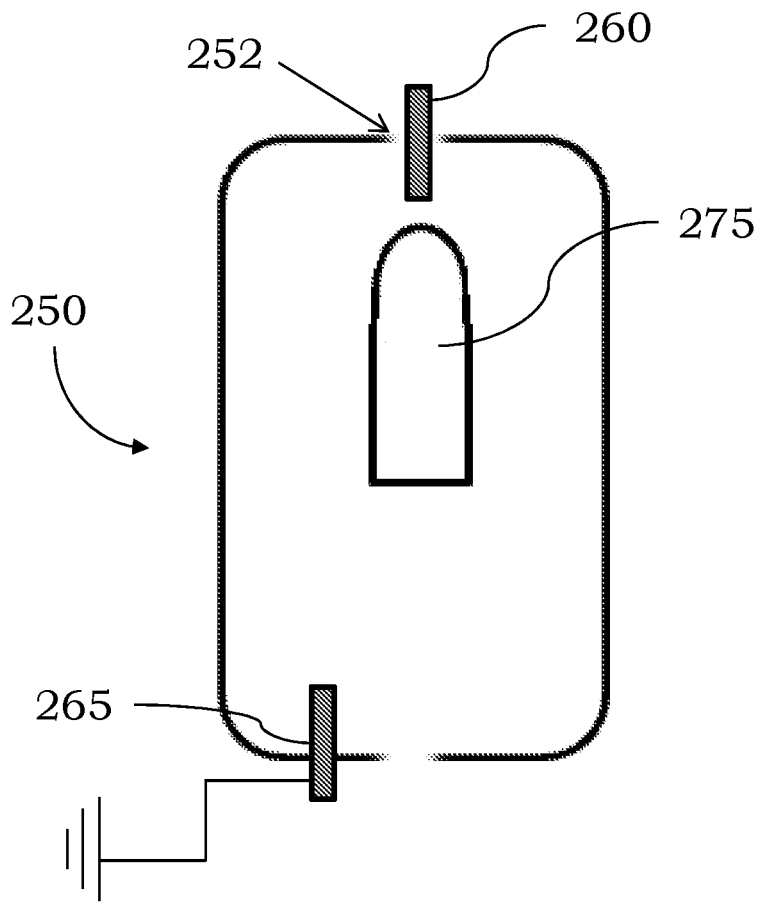
FIG. 2B is an illustration showing an electrode positioned within an inlet of a discharge chamber and a second electrode present in the discharge chamber, in accordance with certain embodiments.

In certain examples and referring to FIG. 2B, a discharge tube or chamber may comprise two or more separate electrodes. The discharge chamber 250 comprises a first electrode 260 and a second electrode 265 spatially separated from the first electrode 260. The second electrode 265 can be electrically coupled to ground or may be provided with a voltage from a power source. In examples where each of the first electrode 260 and the second electrode 265 is provided a voltage, the discharge chamber itself can be electrically coupled to ground. In some examples, the chamber 250 may not be conductive, and the first electrodes 260 and second electrode 265 can be used to sustain a plasma discharge 275. The voltages provided to the electrodes 260, 265 can be the same or can be different and may be different for different analytes. Similarly, different voltages can be provided to the electrodes 260, 265 when different plasma gases are introduced into the chamber 250 through an inlet 252.

Figure 3A:
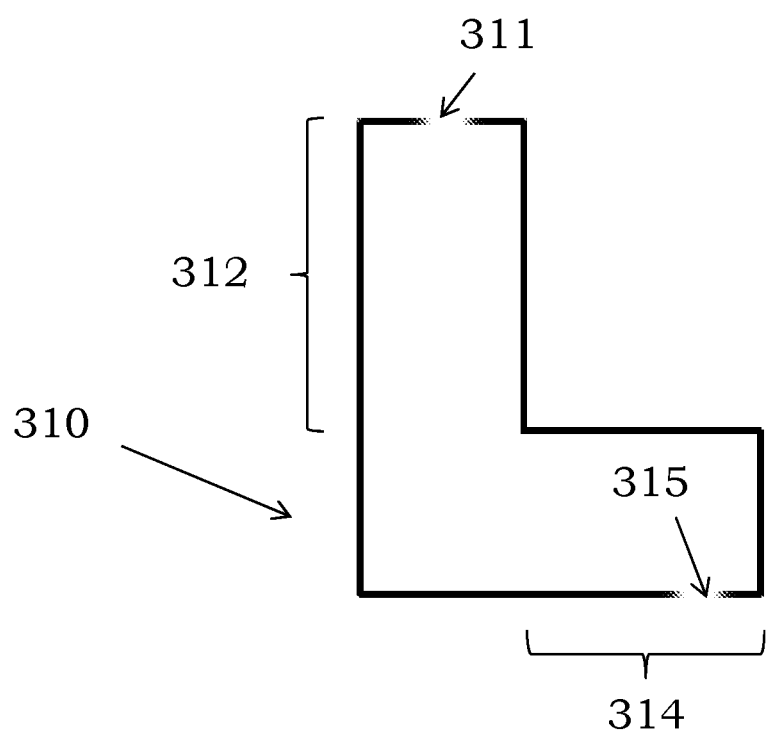
FIG. 3A is an illustration showing a discharge chamber comprising a hard bend, in accordance with some embodiments.

In some examples, the discharge chamber or tube may comprise one or more bends which can enhance removal of metastable atoms or free electrons or both. Referring to FIG. 3A, a discharge chamber 310 is shown comprising a first region 312 and a second region 314. An inlet 311 is present in the first region 312, and an outlet 315 is present in the second region 314. A longitudinal axis of the second region 314 is generally orthogonal to a longitudinal axis of the first region 312. The chamber of FIG. 3A comprises a "hard bend" in that the transition from the first region 312 to the second region 314 is abrupt. Depending on the particular interfering species that are present in an analyte sample, it may be desirable to include a hard bend in a discharge tube to enhance removal of the interfering species, as some interfering species may generally adopt a linear path from the inlet 311 and strike the orthogonal surface of the second region 314. In contrast, analyte ions can be entrained in the flowing plasma gas and exit the chamber through the outlet 315. In some embodiments, an inner diameter of the first region 312 and second region 314 can be the same. In other embodiments, an average inner diameter of the first region 312 is smaller than an average inner diameter of the second region 314. In yet other instances, an average inner diameter of the first region 312 is greater than an average inner diameter of the second region 314. The inner diameter of each of the regions 312, 314 need not be constant along the length of each region but can vary if desired. The materials present in the first region 312 and the second region 314 may also be the same or may be different. The overall shapes of the regions 312, 314 may also be the same or may be different. Further, the exact length or other dimensions of the hard bend area may vary. While not shown, one or more electrodes may be used with the chamber 310, e.g., a voltage can be provided to the electrode and used with the chamber 310 to sustain a plasma discharge within some portion of the chamber 310. The chamber 310 may be conductive or non-conductive depending on the other components that are used with the chamber 310. Where an electrode is used with the chamber 310 it is typically positioned adjacent or near an inlet of the first region 312, though this positioning is not required.

In certain embodiments, a discharge chamber or tube may comprise a soft bend rather than a hard bend. Referring to FIG. 3B, a discharge chamber or tube 350 is shown comprising a first region 352 and a second region 354. An inlet 351 is present in the first region 352, and an outlet 355 is present in the second region 354. A longitudinal axis of the second region 354 is also generally orthogonal to a longitudinal axis of the first region 352. The chamber of FIG. 3B comprises a "soft bend" in that the transition from the first region 352 to the second region 354 is gradual and is similarly shaped to a 90-degree elbow commonly used as fluid couplers in plumbing or tubing connections. Depending on the particular interfering species that are present in an analyte sample, it may be desirable to include a soft bend in a discharge chamber to enhance removal of the interfering species, as some interfering species may be removed in the presence of a soft bend. Analyte ions can be entrained in the flowing plasma gas and exit the chamber through the outlet 355. In some embodiments, an inner diameter of the first region 352 and second region 354 can be the same. In other embodiments, an average inner diameter of the first region 352 is smaller than an average inner diameter of the second region 354. In yet other instances, an average inner diameter of the first region 352 is greater than an average inner diameter of the second region 354. The inner diameter of each of the regions 352, 354 need not be constant along the length of each region but can vary if desired. The materials present in the first region 352 and the second region 354 may also be the same or may be different. The overall shapes of the regions 352, 354 may also be the same or may be different. Further, the exact length or other dimensions of the soft bend area may vary. While not shown, one or more electrodes may be used with the chamber 350, e.g., a voltage can be provided to the electrode and used with the chamber 350 to sustain a plasma discharge within some portion of the chamber 350. The chamber 350 may be conductive or non-conductive depending on the other components that are used with the chamber 350. Where an electrode is used with the chamber 350 it is typically positioned adjacent or near an inlet of the first region 352, though this positioning is not required. The exact angle through which the soft bend curves may vary, for example, from about 60 degrees to about 90 degrees.

In some embodiments, the discharge chamber or tube may comprise more than a single bend. By including more than one bend, removal of interfering species such as, for example, metastable atoms, free electrons and photons can be improved so analyte molecules exiting the discharge chamber or tube substantially free of these interfering species. Referring to FIG. 4A, a discharge chamber or tube 410 is shown that comprises an inlet 411, a first region 412, a first bend 413, a second region 414 coupled to the first region 412 through the first bend 413, a second bend 415 and a third region 416 coupled to the second region 414 through the second bend 415. The third region 416 comprises an outlet 417. While the bends 413, 415 shown in FIG. 4A are shown as both being soft bends, it may be desirable to include one hard bend and one soft bend or two hard bends depending on the particular interfering species that might be present. Further, the overall length of the bends 413, 415 need not be the same, and it may be desirable to lengthen the downstream bend 415 to further enhance removal of interfering species. Similarly, it may be desirable to increase an overall inner diameter of the second bend 415 to alter the pressure flow at that end of the discharge chamber 410. For example, by increasing a diameter of the second bend 415 and the third region 416, the gas flows and pressures in the chamber 410 can be altered to promote laminar flow or some other type of desired flow. While not shown, one or more electrodes may be used with the chamber 410, e.g., a voltage can be provided to the electrode and used with the chamber 410 to sustain a plasma discharge within some portion of the chamber 410. The chamber 410 may be conductive or non-conductive depending on the other components that are used with the chamber 410. Where an electrode is used with the chamber 410 it is typically positioned adjacent or near the inlet 411 of the first region 412, though this positioning is not required.

Figure 4B:
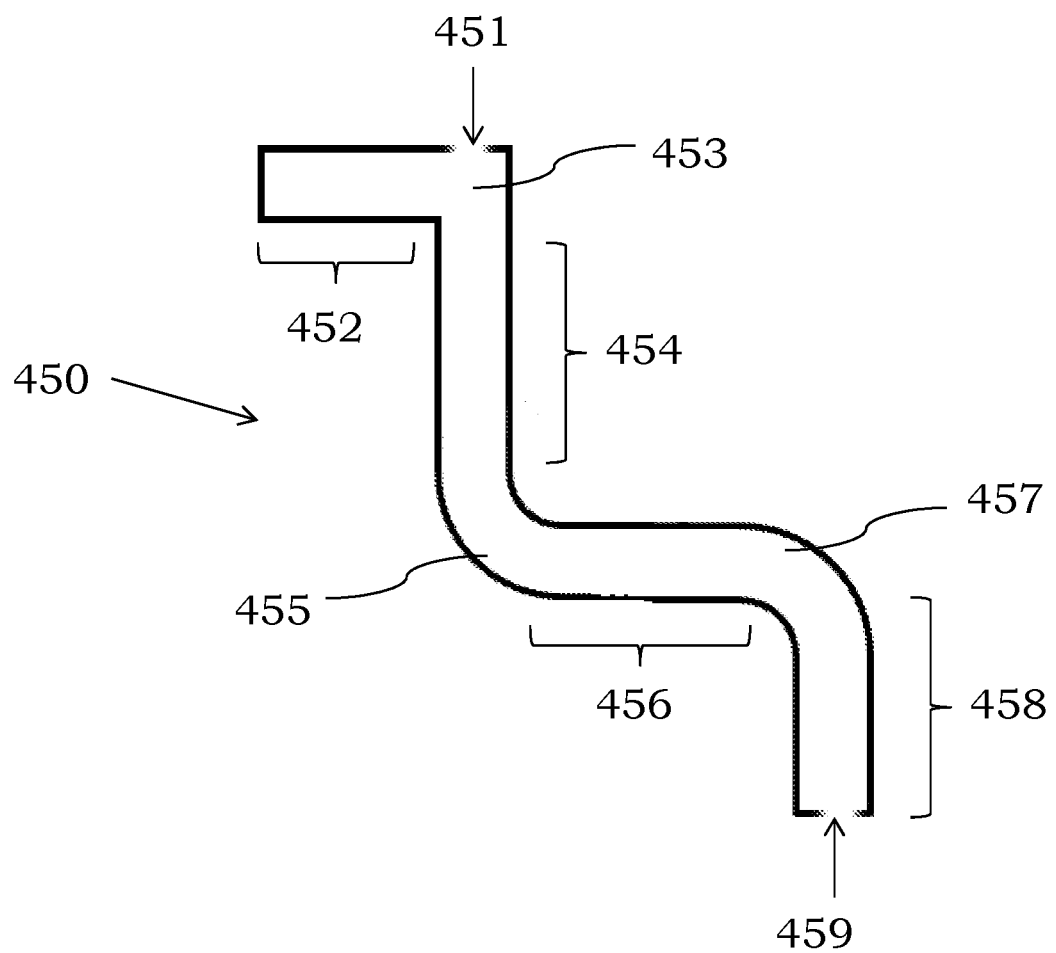
FIG. 4B is an illustration of a discharge chamber comprising three bends, in accordance with some examples.

In certain examples, a discharge tube or chamber may comprise three or more bends. Referring to FIG. 4B, a discharge chamber or tube 450 is shown that comprises an inlet 451, a first region 452, a first bend 453, a second region 454 coupled to the first region 452 through the first bend 453, a second bend 455, a third region 456 coupled to the second region 454 through the second bend 455, a third bend 457, and a fourth region 458 coupled to the third region 456 through the third bend 457. The fourth region 458 comprises an outlet 459. While the bends 455 and 457 shown in FIG. 4B are shown as being soft bends, it may be desirable to include more than one hard bend depending on the particular interfering species that might be present. Further, the overall length of the bends 453, 455, 457 need not be the same, and it may be desirable to lengthen the downstream bend 457 to further enhance removal of interfering species. Similarly, it may be desirable to increase an overall inner diameter of the third bend 457 to alter the pressure flow at that end of the discharge chamber 450. For example, by increasing a diameter of the third bend 457 and the fourth region 458, the gas flows and pressures in the chamber 450 can be altered to promote laminar flow or some other type of desired flow. While not shown, one or more electrodes may be used with the chamber 450, e.g., a voltage can be provided to the electrode and used with the chamber 450 to sustain a plasma discharge within some portion of the chamber 450. The chamber 450 may be conductive or non-conductive depending on the other components that are used with the chamber 450. Where an electrode is used with the chamber 450 it is typically positioned adjacent or near the inlet 451 of the first region 452, though this positioning is not required.

Figure 4C:
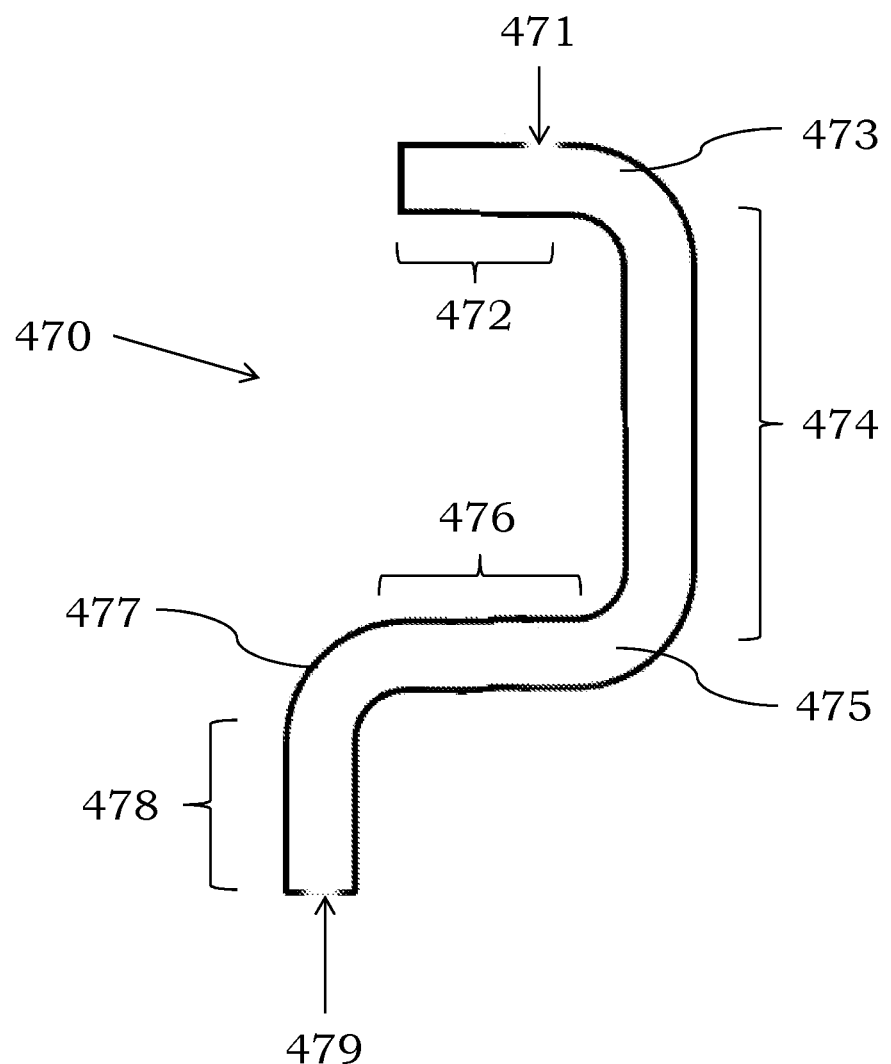
FIG. 4C is an illustration of a discharge chamber comprising two bends of different configurations, in accordance with some examples.

In certain embodiments, the discharge chamber or tube may comprise two or more bends whose orientations differ. By including more than one bend with a different orientation, enhanced removal of interfering species such as, for example, metastable atoms, free electrons and photons can be achieved so analyte molecules exiting the discharge chamber or tube substantially free of these interfering species. Referring to FIG. 4C, a discharge chamber or tube 470 is shown that comprises an inlet 471, a first region 472, a first bend 473, a second region 474 coupled to the first region 472 through the first bend 473, a second bend 475, a third region 476 coupled to the second region 474 through the second bend 475, and a fourth region 478 coupled to the third region 476 through a bend 477. The fourth region 478 comprises an outlet 479. While the bends 473, 475, and 477 shown in FIG. 4C are all shown as being soft bends, it may be desirable to include one hard bend and two soft bends or two hard bends depending on the particular interfering species that might be present. Further, the overall length of the bends 473, 475, 477 need not be the same, and it may be desirable to lengthen the downstream bend 477 to further enhance removal of interfering species. Similarly, it may be desirable to increase an overall inner diameter of the bend 477 to alter the pressure flow at that end of the discharge chamber 470. For example, by increasing a diameter of the third bend 477 and the third region 476 and fourth region 478, the gas flows and pressures in the chamber 470 can be altered to promote laminar flow or some other type of desired flow. In this illustration the bend 473 may be considered a +90 degree bend, and the bend 475 may be considered a −90 degree bend. By altering the gas flow direction with the different orientations of the bends 473, 475, enhanced collision of interfering species with the walls of chamber 470 can be achieved, which can act to remove these interfering species. Analyte ions may be entrained within a central gas flow which moves down the chamber 470 and exits through the outlet 479. While not shown, one or more electrodes may be used with the chamber 470, e.g., a voltage can be provided to the electrode and used with the chamber 470 to sustain a plasma discharge within some portion of the chamber 470. The chamber 470 may be conductive or non-conductive depending on the other components that are used with the chamber 470. Where an electrode is used with the chamber 470 it is typically positioned adjacent or near the inlet 471 of the first region 472, though this positioning is not required.

Figure 5A:
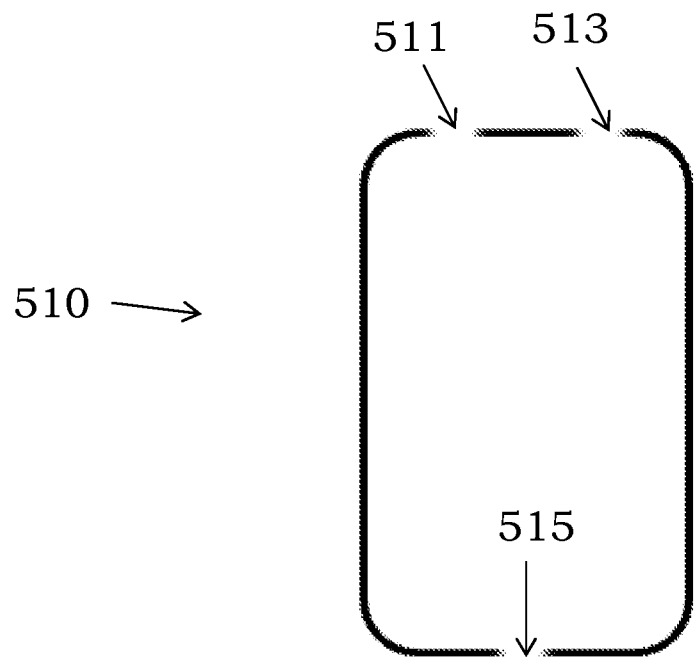
FIG. 5A is an illustration of a discharge chamber comprising two inlets, in accordance with some configurations.

In some examples, the discharge chambers described herein may comprise more than a single inlet. Referring to FIG. 5A, a discharge chamber 510 comprises a first inlet 511 and a second inlet 513 and an outlet 515. In some examples, the inlets 511, 513 can be fluidically coupled to different plasma gases so only one plasma gas may enter into the chamber 510 at any time. In other instances, the inlets 511, 513 can be used to simultaneously introduce two different plasma gases into the chamber 510. The pressures and flow rates of the different plasma gases may be the same or different, and inline mixing of the two gases may be accomplished within the chamber 510.

Figure 5B:
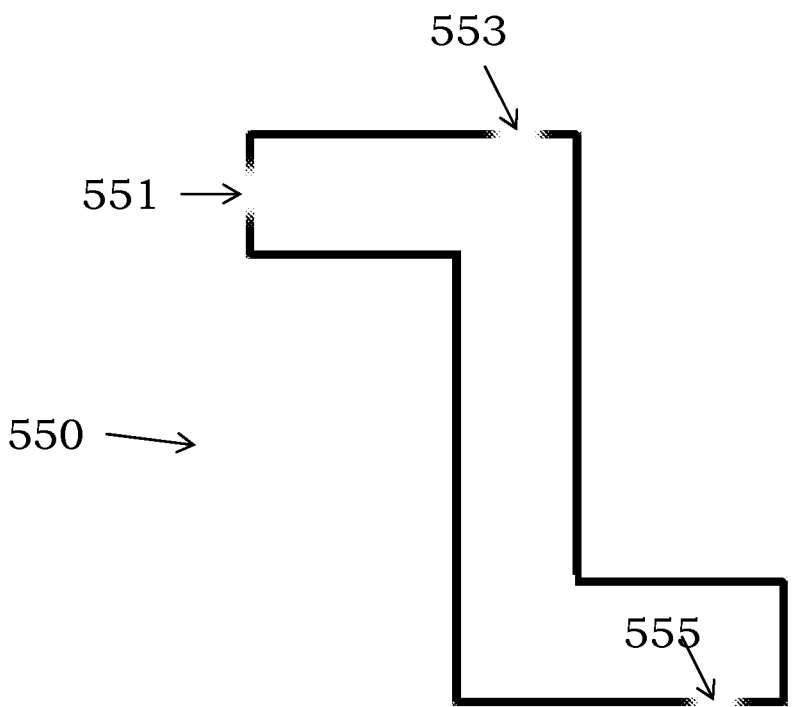
FIG. 5B is another illustration of a discharge chamber comprising two inlets, in accordance with certain examples.

In other configurations, a sample can be introduced through one of the inlets 511, 513 and a plasma gas can be introduced into the other of the inlets 511, 513. The configuration of FIG. 5A would introduce the sample into the chamber coaxially with the plasma gas through the inlets 511, 513. If desired, however, one of the plasma gas and sample could be introduced into the chamber in a non-coaxial manner. For example and referring to FIG. 5B, a chamber 550 is shown that comprise a first inlet 551 and a second inlet 553 and an outlet 555. The second inlet 553 is generally orthogonal to the first inlet 551. If desired, two different plasma gases could be introduced through the inlets 551, 553 and another inlet could be present to introduce sample into the chamber 550. The additional inlet for the sample may be coaxial with the inlet 551 or the inlet 553 or could be positioned at a different angle with respect to the inlets 551, 553.

Figure 5C:
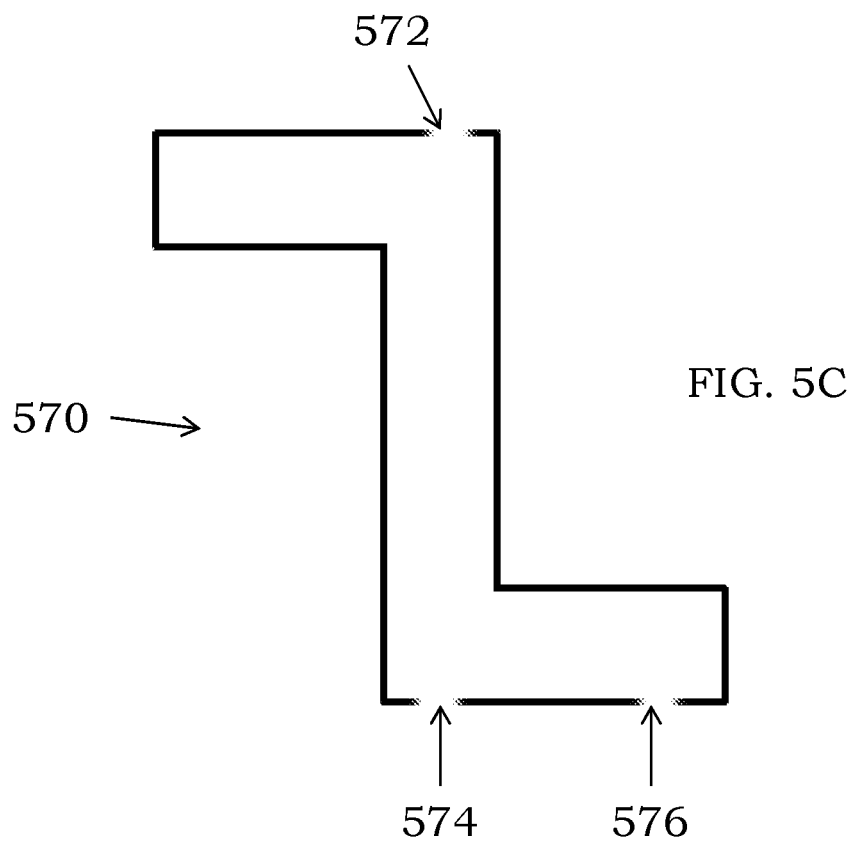
FIG. 5C is an illustration of a discharge chamber comprising two outlets, in accordance with some examples.

In some examples, a discharge chamber may comprise more than one outlet. Referring to FIG. 5C, a discharge chamber 570 is shown that comprises an inlet 572, a first outlet 574 and a second outlet 576. The first outlet 574 and second outlet 576 can be positioned in many different positions and one or more of the outlets 574, 576 can be blocked if desired so ions only exit through one of the outlets 574, 576.

Figure 6A:
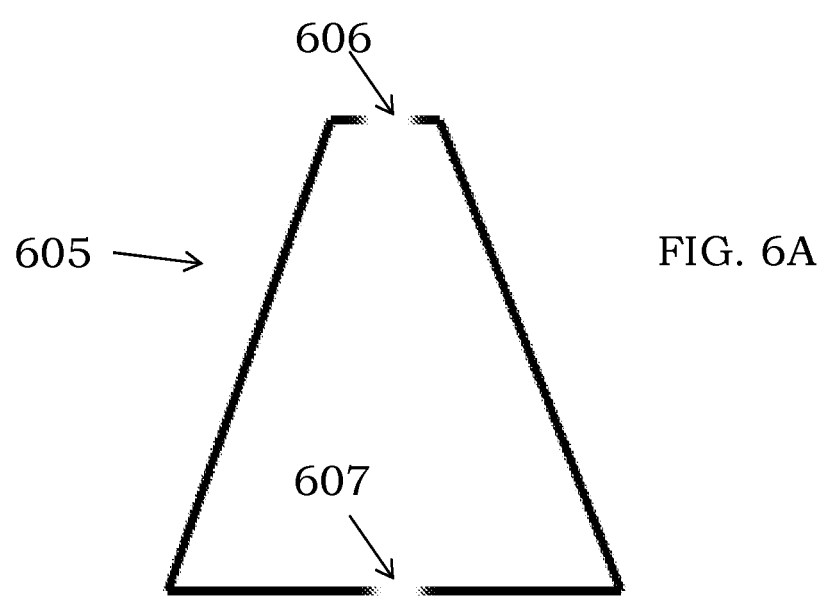
FIG. 6A is an illustration of a straight chamber comprising a variable diameter, in accordance with some examples.

In certain examples, the discharge chambers described herein may comprise a variable inner diameter at different portions of the discharge chamber. Referring to FIG. 6A, a discharge chamber 605 comprises an inlet 606 and an outlet 607. An inner diameter of the discharge chamber 605 increases from the inlet 606 to the outlet 607. If desired, however, an average inner diameter may decrease from the inlet 606 to the outlet 607. The change in size of the inner diameter from one end of the chamber 605 to the other end of the chamber 605 need not be linear or conical and may instead be bell shaped or take other forms and shapes as desired.

Figure 6B:
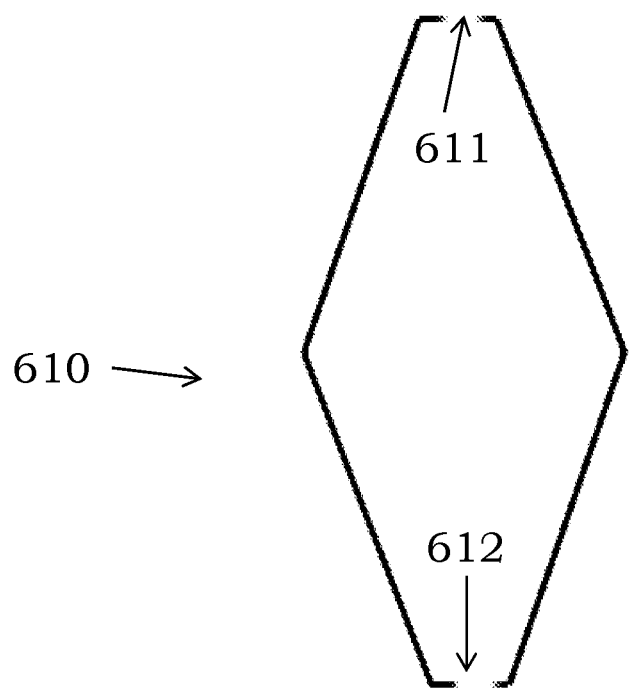
FIG. 6B is another illustration of a straight chamber comprising a variable diameter, in accordance with some configurations.
Figure 6C:
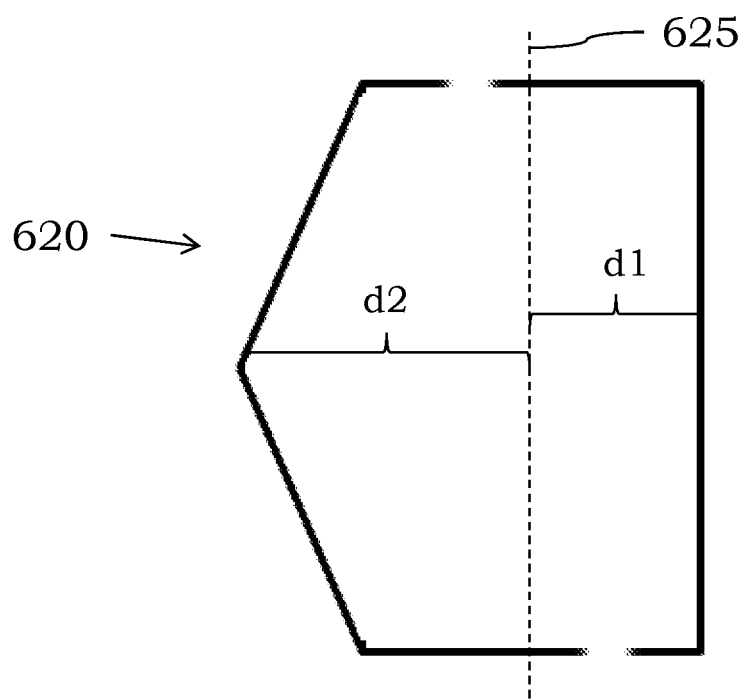
FIG. 6C is an illustration of a straight chamber with a variable diameter, in accordance with some examples.

In some examples, the inner diameter of the discharge chamber may be variable at different portions of the discharge chamber. Referring to FIG. 6B, a discharge chamber 610 comprises an inlet 611 and an outlet 612. The inner diameter of the chamber 610 increases from the inlet 611 toward a central portion of the chamber 610 and then decreases toward the outlet 612 of the chamber 610. The change in inner diameter need not be linear or conical and may not be the same on each side of the chamber 610. For example and referring to FIG. 6C, a distance d1 from a central longitudinal axis 625 of a chamber 620 may be substantially constant along a longitudinal direction of the chamber 620, and a distance d2 from the central longitudinal axis 625 to the other side of the chamber 620 and vary along the longitudinal direction of the chamber 620.

Figure 6D:
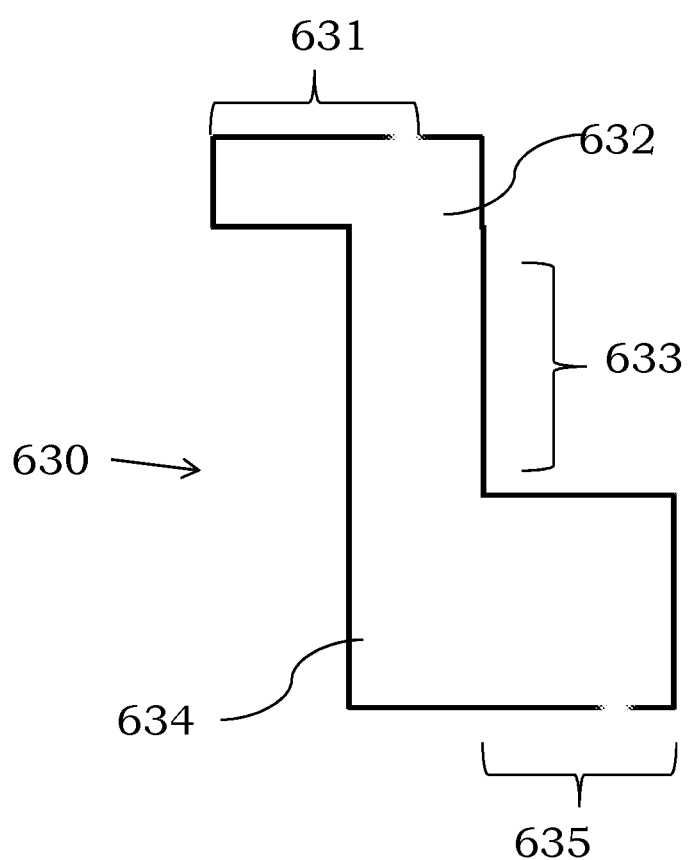
FIG. 6D is an illustration of a bent chamber with a variable diameter, in accordance with certain instances.

In certain embodiments, a discharge chamber comprising one or more bends may also comprise a variable inner diameter along the length of the chamber. Referring to FIG. 6D, a discharge chamber 630 comprises a first region 631 (which may comprise an inlet), a bend 632 and a second region 633 (which may comprise an outlet) coupled to the first region 631 through the bend 632. An inner diameter of the second region 633 is (on average) greater than an inner diameter of the first region 631. By increasing the inner diameter from the first region 631 to the second region 633, it can be possible to alter the flow characteristics through the chamber 630 such that certain interfering species are removed and do not exit the chamber 630 to any substantial degree. In other instances, an inner diameter from an inlet end to an outlet end of the discharge chamber may decrease. The chamber 630 also comprises a third region 635 coupled to the second region 633 through a bend 634. An inner diameter of the third region 635 may be larger than an inner diameter of the second region 633 to alter the flow characteristics through the discharge chamber 630.

Figure 7A:
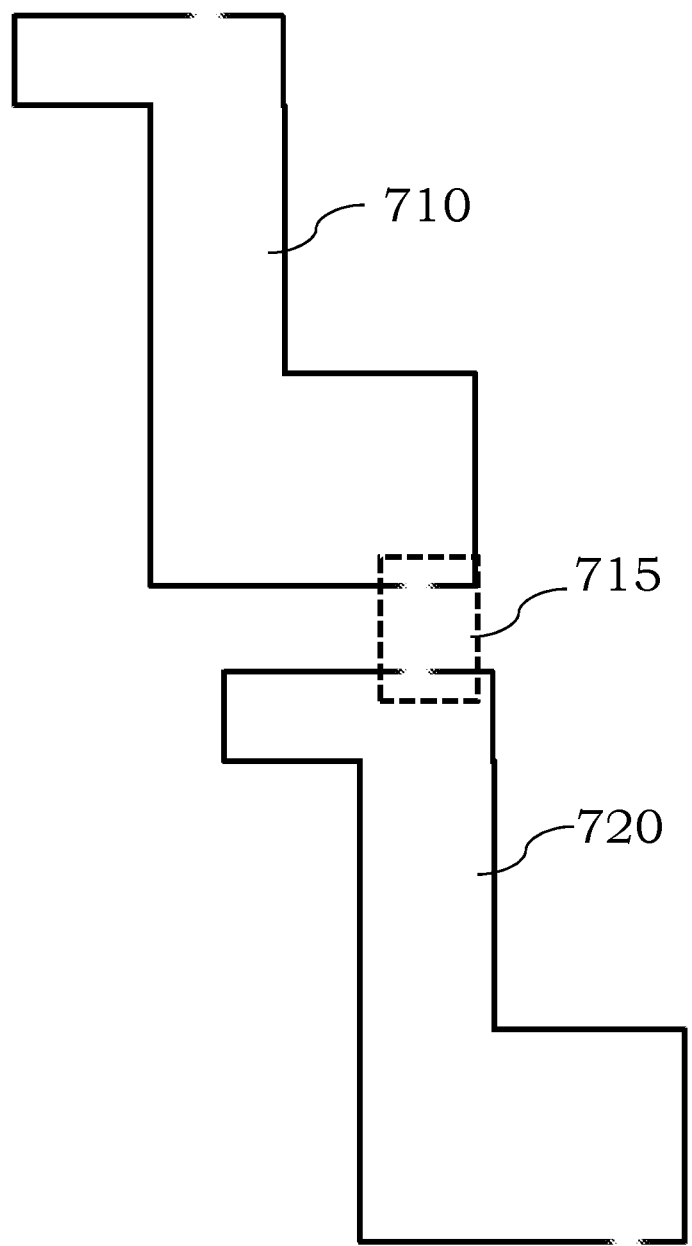
FIG. 7A is an illustration of two discharge chambers coupled to each other, in accordance with some examples.
Figure 7B:
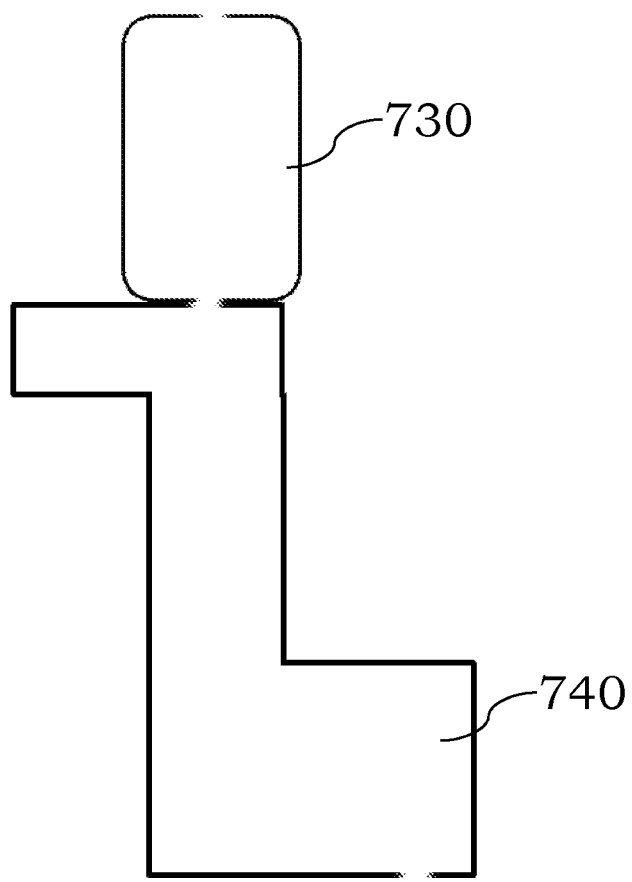
FIG. 7B is another illustration of two discharge chambers coupled to each other, in accordance with some examples.

In certain configurations, two or more of the discharge chambers can be fluidically coupled to each other to permit analyte ions to travel from one chamber to another chamber. For example and referring to FIG. 7A, a first discharge chamber 710 is shown as being coupled to a second discharge chamber 720 through an interface 715. Sample and/or plasma gas may enter into the assembly through an inlet or inlets of the chamber 710. If desired, the interface 715 could be omitted and a terminal end of the discharge chamber 710 could be sized and arranged to couple to a upstream end of the chamber 720 through a friction fit, e.g., by plugging the first chamber 710 into the second chamber 720. The friction fit may be suitably tight to retain the two chambers to each other or fasteners, adhesives, joints or fittings can be used to retain the two chambers 710, 720 to each other at least during analysis. In some instances, the discharge chamber may be constructed and arranged as a module which can couple to another modular discharge chamber to permit the user to select the overall length and nature of the coupled assembly. While the two chambers 710, 720 are shown as being substantially the same in FIG. 7A, this feature is not required. Referring to FIG. 7B, a straight discharge chamber 730 is shown as being coupled to a bent discharge chamber 740. Sample and/or plasma gas may enter into the assembly through an inlet or inlets of the chamber 730. If desired, the orientation could be reversed so that sample and/or plasma gas would enter into chamber 740. The orientation of the coupled assembly also need not be the same.

Figure 7C:
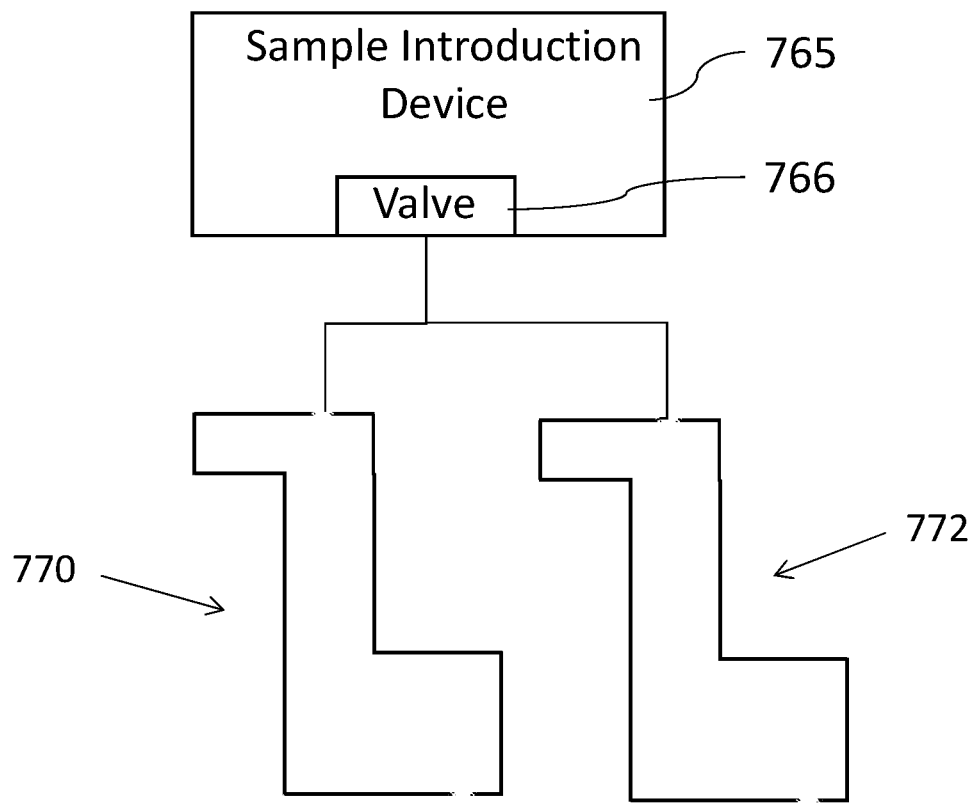
FIG. 7C is an illustration of two discharge chambers in parallel, in accordance with some examples.

In some embodiments, two or more discharge chambers arranged in a parallel manner may be coupled to an inlet of a mass analyzer. Referring to FIG. 7C, a first discharge chamber 770 and a second discharge chamber 772 are shown. Each of the chambers 770, 772 is fluidically coupled to an upstream sample introduction device 765. The sample introduction device 765 can be configured to direct analyte to one or both of the chambers 770, 772. For example, the sample introduction device 765 may comprise a solenoid valve 766 which can fluidically couple and decouple the sample flow to one of the chambers 770, 772 or sample flow can be split and provided to both chambers. The chambers 770, 772 could be configured differently so different analyte species can be provided to one of the different chambers. For example, it may be desirable to provide a first analyte to a straight chamber if it is believed few interfering species may result from ionization using a plasma discharge sustained with the straight chamber. For a second analyte, it may be desirable to provide a second analyte to a bent chamber if it is believed more interfering species will be generated and need to be removed prior to exit of any ions from the chamber. The chambers 770, 772 may be fluidically coupled separately to a downstream component, e.g., a mass analyzer, or can be fluidically coupled to a downstream component through a common interface (not shown). While not shown, three, four or more chambers could be arranged in parallel. Further, any one parallel chamber may comprise a single discharge chamber or two or more discharge chambers coupled to each other.

In some configurations where two or more discharge chambers are fluidically coupled to each other, each of the discharge chambers may be configured to sustain a respective plasma discharge or only one of the discharge chambers may be configured to sustain a plasma discharge. In some examples, the two discharge chambers may use the same plasma gas but a different voltage can be provided to each of the chambers (or an electrode or electrodes of each chamber). In other examples, the two discharge chambers may use different plasma gases and a similar voltage can be provided to the chamber (or an electrode or electrodes of the chamber). In some embodiments, the two discharge chambers may use different plasma gases and a different voltage can be provided to each chamber (or an electrode or electrodes of each chamber). The use of two serially arranged discharge chambers permits operation of one plasma or two plasmas depending on the desired analyte sample. In some examples, the more upstream discharge chamber (relative to the position of an inlet) can be used to sustain a plasma discharge, and the downstream discharge chamber may be used to provide additional length to remove more interfering species. In other instances, the more downstream discharge chamber can be used to sustain a plasma discharge, and the upstream discharge chamber may be used to mix sample with a gas or other species. For example, different gases can be introduced into the upstream chamber along with the sample to mix the gases and sample prior to the mixture reaching a plasma discharge sustained in the downstream chamber.

In certain embodiments, the exact plasma gas selected for use in the discharge sources described herein may vary. The plasma gas may be, for example, helium, neon, argon, krypton, xenon, nitrogen, nitric oxide, ammonia, oxygen, ozone, air, compressed air, hydrogen, methane, carbon monoxide, carbon dioxide, and nitrogen dioxide. Other gases are also possible. In some examples, two or more of these gases can be used in a gas mixture to sustain a plasma discharge within a discharge chamber. The gas composition can be varied with different analytes species in a sample if desired. For example, a first gas can be used to sustain a plasma discharge when a first analyte is introduced into the discharge chamber. Once the first analyte is ionized and exits the chamber, a second gas can then be introduced to sustain a plasma discharge when the second analyte is introduced into the discharge chamber. By selecting the particular plasma gas, more selective ionization of each analyte in a sample can be achieved.

In some examples, the flow rate of the plasma gas can be selected to provide a desired pressure within the discharge chamber. For example, the plasma discharge can be sustained at a pressure of about $10^{-3}$ Torr to about 100 Torr. The pressure need not be constant during operation of the plasma discharge. For example, for certain analytes it may be desirable to operate the plasma discharge at higher or lower pressures. In some embodiments and without wishing to be limited by these illustrative flow rates, the gas flow rate into the discharge chamber may be, for example, about 500 standard cubic centimeters per minute (sccm), or less than 500 sccm or less than 150 sccm or less than 100 sccm. In comparison to conventional inductively coupled plasmas, which often operate at argon flow rates of 15 Liters/minute or more, the gas flow rates used in the discharge chambers described herein are significantly lower, which can result in costs savings and more efficient operation of the devices. It is a significant attribute that the plasma discharge can be sustained using such low flow rates. If desired, the discharge chamber may also be heated or cooled using gases or external heating or cooling devices. For example, a heating or cooling device can be thermally coupled to the discharge chamber to control the temperature of the discharge chamber. The heating or cooling device need not be thermally coupled to the entire chamber but may be thermally coupled, for example, to areas adjacent to the plasma discharge to reduce the likelihood of melting of the chamber at these areas.

In some embodiments, the discharge chambers described herein may comprise one or more conductive materials or one or more areas comprising a conductive material. As noted in many instances, the entire chamber need not be conductive and the chamber can be rendered conductive using an electrode, a coating or by including conductive materials at certain areas. In some examples, a conductive coating can be present at an inlet end and at a region downstream of the inlet end. The inlet end may be electrically coupled to a power source, and the downstream region can be electrically coupled to a power source or ground. If desired, the entire chamber could be constructed of a conductive material. Notwithstanding the conductive materials can be placed and arranged in many different ways in the chamber, the conductive material may comprise one or more of a stainless steel, a nickel chromium alloy, nickel chromium molybdenum alloy, titanium, a titanium alloy, a lanthanide, a lanthanide alloy, an actinide, an actinide alloy and combinations thereof. While these materials are not required, high temperature metal-based materials can have increased lifetimes and reduced maintenance needs.

Figure 8:
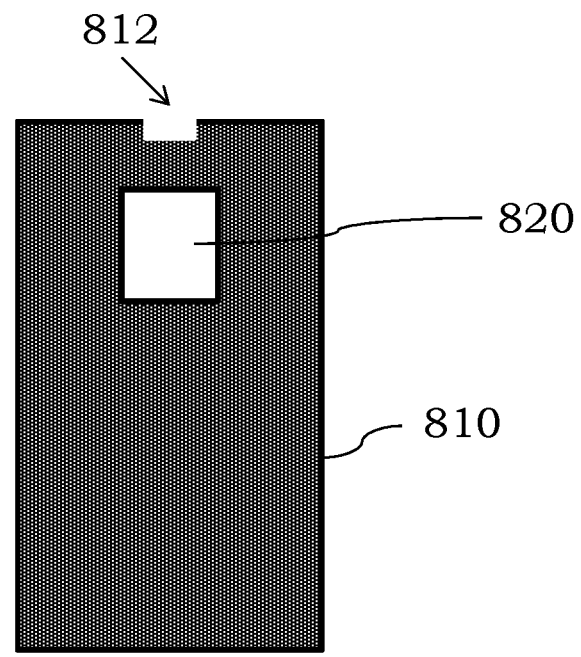
FIG. 8 is an illustration of a discharge chamber comprising an optical window, in accordance with some examples.

In some instances where the discharge chamber comprises a metal, the metal may render the chamber optically opaque. If desired, an optical window can be present in the discharge chamber to permit viewing of any plasma discharge. Referring to FIG. 8, an optical window 820 is shown as being present toward an inlet end 812 of a discharge chamber 810. The optical window may comprise quartz or other optically transparent materials to permit a user to determine if the plasma discharge is sustained within the chamber 810. An optical sensor can be present in a device to receive light emissions from the plasma discharge as a safety mechanism. For example, if the plasma discharge extinguishes, an optical sensor may be present and can be configured to turn off the voltage provided to the chamber (or an electrode used with the chamber) as a safety mechanism. In addition, the sensor may switch off any plasma gas flow to conserve the gas. During ignition of the plasma, there may be a time window where the optical sensor is disabled to permit gas flow and plasma ignition prior to the safety sensor initiating termination of the voltage and/or plasma gas flow. In other instances, no optical window may be present, and the current provided to the chamber (or an electrode used with the chamber) can be monitored to determine if the plasma discharge is sustained or has been extinguished.

In some configurations, the exact voltage provided to the conductive region or electrodes used in the discharge chambers described herein may also vary. As noted herein, the voltage can change with different analytes and/or different plasma gases. The voltage provided may be provided from a direct current source, an alternating current source or a radio frequency source. Where a direct current voltage is used, the voltage may vary from about 10 Volts to about 5000 Volts. The direct current voltage can be positive or can be negative, e.g., +/10 Volts to +/−5000 Volts. Where an alternating current voltage can be used, the alternating current may vary, for example, from about 20 Volts to about 3000 Volts. The alternating current voltage can be positive or can be negative, e.g., +/20 Volts to +/−3000 Volts. Where a radio frequency current is used, the radio frequency range may be from about 100 Hz to about 10 MHz. The voltages values listed herein are provided for illustration purposes only and not intended to limit the exact voltage values that may be used. If desired, different types of current can be used with different analytes. For example, as a first analyte is introduced into the discharge chamber, a plasma discharge can be sustained using an alternating current to ionize the first analyte. As a second analyte is introduced into the discharge chamber, a direct current can be used to sustain a plasma discharge to ionize the second analyte. In examples where two or more discharge chambers are coupled to each other, one of the discharge chambers can use a first type of voltage to sustain a first plasma discharge and the other discharge chamber can use a different type of voltage to sustain a second plasma discharge.

Figure 9A:
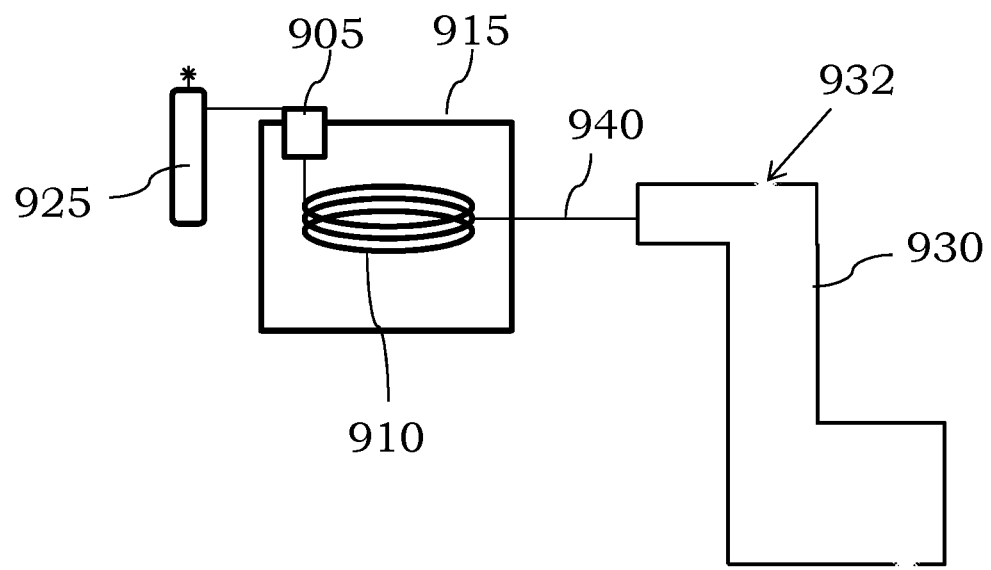
FIG. 9A is an illustration of a gas chromatography system fluidically coupled to a discharge chamber, in accordance with some examples.

In certain examples, the discharge chambers described herein can be used in a system comprising one or more other components. For example, the discharge chamber may be fluidically coupled to an upstream component that can provide an analyte to the inlet of the discharge chamber and/or can be fluidically coupled to a downstream component to provide ions to the downstream component for analysis or further use. Referring to FIG. 9A, a discharge chamber 930 is shown as being fluidically coupled to a gas chromatography system. The gas chromatography system comprises an injector 905 fluidically coupled to a column 910 positioned in an oven 915. The injector 905 and/or column 910 are also fluidically coupled to a mobile phase 925, i.e. a gas, which can be used with a stationary phase of the column 910 to separate two or more analytes in an introduced sample. As individual analytes elute from the column 910, they can be provided to an inlet of the discharge chamber 930 for ionization. As shown in FIG. 9A, the inlet to introduce sample is different than an inlet 932 for introducing a plasma gas, though the sample inlet could be the same if desired. While the column 910 is shown as being directly coupled to an inlet of the discharge chamber 930, one or more transfer lines, interfaces, etc. could instead be used. For example, a transfer line 940 can be used to fluidically couple the column 910 to an inlet of the discharge chamber 930. The transfer line 940 may be heated (if desired or needed) to maintain the analytes in the gas phase. Additional components may also be present between the column 910 and the chamber 930, e.g., interfaces, splitters, an optical detection cell, concentration chambers, filters and the like.

Figure 9B:
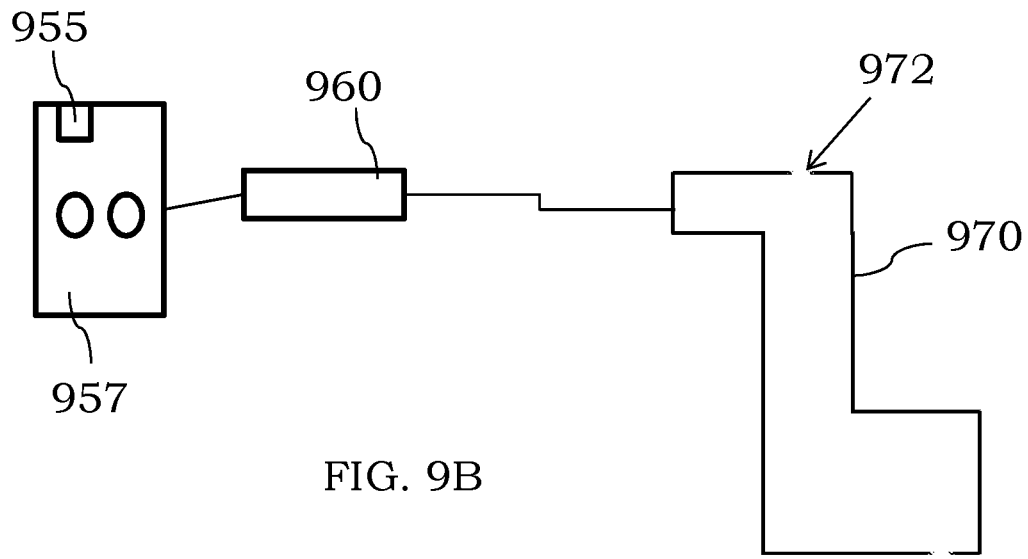
FIG. 9B is an illustration of a liquid chromatography system fluidically coupled to a discharge chamber, in accordance with some examples.

In some embodiments, a discharge chamber can be fluidically coupled to a liquid chromatography (LC) system. Referring to FIG. 9B, a LC system comprises an injector 955 fluidically coupled to a column 960 through one or more pumps 957. The injector 955 and/or column 960 are also fluidically coupled to a mobile phase, i.e. a liquid, and the one or more pumps 957 which can be used to pressurize the LC system. The column 960 typically comprises a stationary phase selected to separate two or more analytes in an introduced sample. As individual analytes elute from the column 960, they can be provided to an inlet of a discharge chamber 970 for ionization. While the column 960 is shown as being directly coupled to an inlet of the discharge chamber 970, one or more transfer lines, interfaces, etc. could instead be used. For example, a flow splitter can be used if desired. Additional components may also be present between the column 960 and the chamber 970, e.g., interfaces, splitters, an optical detection cell, concentration chambers, filters and the like. As shown in FIG. 9B, an inlet for introducing the sample from the LC system is different than an inlet 972 for introducing a plasma gas, though they may be the same if desired.

Figure 10:
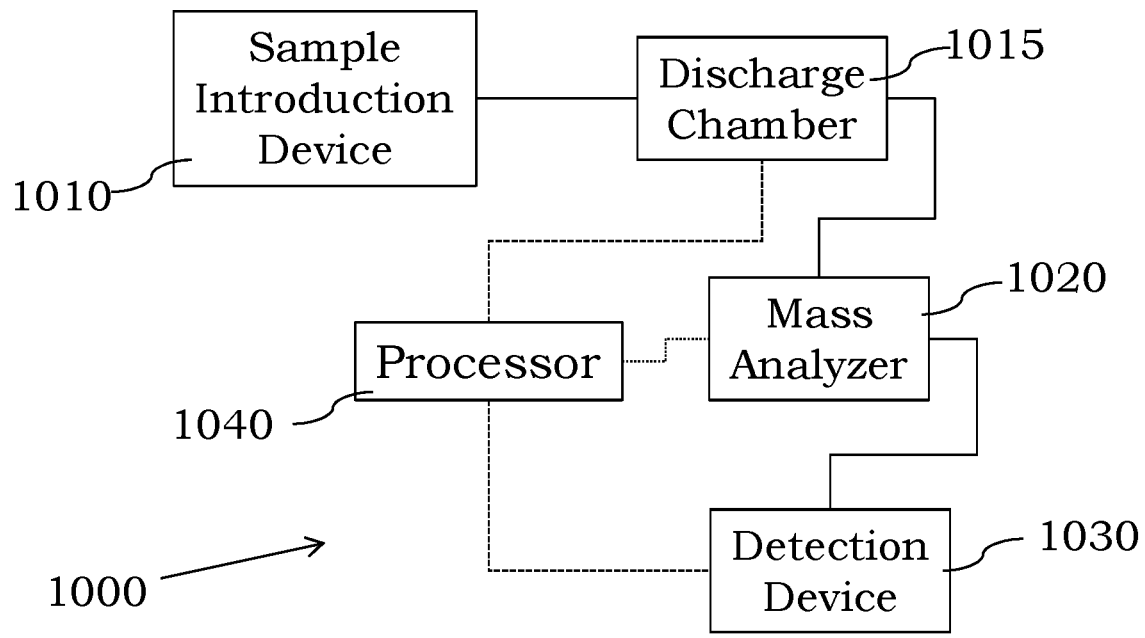
FIG. 10 is an illustration of a mass spectrometry system comprising a discharge chamber, in accordance with certain examples.

In some examples, the discharge chamber can be present in a mass spectrometer. For example, the discharge chambers disclosed herein may also be used in or with a mass analyzer. In particular the mass spectrometer may include one or more discharge chambers directly coupled to an inlet of a mass analyzer or spatially separated from an inlet of a mass analyzer. An illustrative MS device is shown in FIG. 10. A MS device 1000 includes a sample introduction device 1010, a discharge chamber 1015, a mass analyzer 1020, a detection device 1030, a processor 1040 and an optional display (not shown). The mass analyzer 1020 and the detection device 1030 may be operated at reduced pressures using one or more vacuum pumps and/or vacuum pumping stages as noted in more detail below. The sample introduction device 1010 may be a GC system, an LC system, a nebulizer, aerosolizer, spray nozzle or head or other devices which can provide a gas or liquid sample to the discharge chamber 1015. Where solid samples are used the sample introduction device 1010 may comprise a direct sample analysis (DSA) device or other devices which can introduce analyte species from solid samples. The discharge chamber 1015 may be any of those described herein or other suitable discharge chambers. The mass analyzer 1020 can take numerous forms depending generally on the sample nature, desired resolution, etc. and exemplary mass analyzers are discussed further below. The detection device 1030 can be any suitable detection device that can be used with existing mass spectrometers, e.g., electron multipliers, Faraday cups, coated photographic plates, scintillation detectors, etc. and other suitable devices that will be selected by the person of ordinary skill in the art, given the benefit of this disclosure. The processor 1040 typically includes a microprocessor and/or computer and suitable software for analysis of samples introduced into the MS device 1000. If desired, one or more databases can be accessed by the processor 1040 for determination of the chemical identity of species introduced into the MS device 1000. Other suitable additional devices known in the art can also be used with the MS device 1000 including, but not limited to, autosamplers, such as AS-90plus and AS-93plus autosamplers commercially available from PerkinElmer Health Sciences, Inc.

In certain embodiments, the mass analyzer 1020 of MS device 1000 can take numerous forms depending on the desired resolution and the nature of the introduced sample. In certain examples, the mass analyzer is a scanning mass analyzer, a magnetic sector analyzer (e.g., for use in single and double-focusing MS devices), a quadrupole mass analyzer, an ion trap analyzer (e.g., cyclotrons, quadrupole ions traps), time-of-flight analyzers (e.g., matrix-assisted laser desorbed ionization time of flight analyzers), and other suitable mass analyzers that can separate species with different mass-to-charge ratios. As noted in more detail below, the mass analyzer may comprise two or more different devices arranged in series, e.g., tandem MS/MS devices or triple quadrupole devices, to select and/or identify the ions that are received from the discharge chamber 1015.

In certain other examples, the discharge chambers disclosed herein may be used with existing ionization methods used in mass spectroscopy. For example, a MS instrument with a dual source where one of the sources is a discharge chamber as described herein and the other source is a different ionization source can be assembled. The different ionization source may be, for example, an electron impact source, a chemical ionization source, a field ionization source, desorption sources such as, for example, those sources configured for fast atom bombardment, field desorption, laser desorption, plasma desorption, thermal desorption, electrohydrodynamic ionization/desorption, etc., thermospray or electrospray ionization sources or other types of ionization sources. By including two different ionization sources in a single instrument, a user can select which particular ionization methods may be used.

In accordance with certain other examples, the MS systems disclosed here can be hyphenated with one or more other analytical techniques. For example, a MS system can be hyphenated one or more devices for performing liquid chromatography, gas chromatography, capillary electrophoresis, and other suitable separation techniques. When coupling an MS device to a gas chromatograph, it may be desirable to include a suitable interface, e.g., traps, jet separators, etc., to introduce sample into the MS device from the gas chromatograph. When coupling an MS device to a liquid chromatograph, it may also be desirable to include a suitable interface to account for the differences in volume used in liquid chromatography and mass spectroscopy. For example, split interfaces can be used so that only a small amount of sample exiting the liquid chromatograph is introduced into the MS device. Sample exiting from the liquid chromatograph may also be deposited in suitable wires, cups or chambers for transport to the discharge chamber of the MS device. In certain examples, the liquid chromatograph may include a thermospray configured to vaporize and aerosolize sample as it passes through a heated capillary tube. Other suitable devices for introducing liquid samples from a liquid chromatograph into a MS device, or other detection device, will be readily selected by the person of ordinary skill in the art, given the benefit of this disclosure.

In certain examples, an MS device that includes a discharge chamber may be hyphenated to at least one other MS device, which may or may not include its own discharge chamber, for tandem mass spectroscopy analyses. For example, one MS device can include a first type of mass analyzer and the second MS device can include a different or similar mass analyzer than the first MS device. In other examples, the first MS device may be operative to isolate the molecular ions, and the second MS device may be operative to fragment/detect the isolated molecular ions. It will be within the ability of the person of ordinary skill in the art, to design hyphenated MS/MS devices at least one of which includes a discharge chamber. In some examples, the MS device may comprise two or more quadrupoles which can be configured the same or different. For example, a triple quadrupole assembly as shown in the examples appended hereto may be used to select ions from an ion beam exiting a discharge chamber.

In certain examples, the methods and systems herein may comprise or use a processor, which can be part of the system or instrument or present in an associated device, e.g., computer, laptop, mobile device, etc. used with the instrument. For example, the processor can be used to control the provided voltages to the discharge chamber and any electrodes, can control the mass analyzer and/or can be used by the detector. Such processes may be performed automatically by the processor without the need for user intervention or a user may enter parameters through user interface. For example, the processor can use signal intensities and fragment peaks along with one or more calibration curves to determine an identity and how much of each molecule is present in a sample. In certain configurations, the processor may be present in one or more computer systems and/or common hardware circuitry including, for example, a microprocessor and/or suitable software for operating the system, e.g., to control the sample introduction device, ionization device, mass analyzer, detector, etc. In some examples, the detection device itself may comprise its own respective processor, operating system and other features to permit detection of various molecules. The processor can be integral to the systems or may be present on one or more accessory boards, printed circuit boards or computers electrically coupled to the components of the system. The processor is typically electrically coupled to one or more memory units to receive data from the other components of the system and permit adjustment of the various system parameters as needed or desired. The processor may be part of a general-purpose computer such as those based on Unix, Intel PENTIUM-type processor, Motorola PowerPC, Sun UltraSPARC, Hewlett-Packard PA-RISC processors, or any other type of processor. One or more of any type computer system may be used according to various embodiments of the technology. Further, the system may be connected to a single computer or may be distributed among a plurality of computers attached by a communications network. It should be appreciated that other functions, including network communication, can be performed and the technology is not limited to having any particular function or set of functions. Various aspects may be implemented as specialized software executing in a general-purpose computer system. The computer system may include a processor connected to one or more memory devices, such as a disk drive, memory, or other device for storing data. Memory is typically used for storing programs, calibration curves, and data values during operation of the discharge chamber and any instrument including the discharge chamber. Components of the computer system may be coupled by an interconnection device, which may include one or more buses (e.g., between components that are integrated within a same machine) and/or a network (e.g., between components that reside on separate discrete machines). The interconnection device provides for communications (e.g., signals, data, instructions) to be exchanged between components of the system. The computer system typically can receive and/or issue commands within a processing time, e.g., a few milliseconds, a few microseconds or less, to permit rapid control of the system. For example, computer control can be implemented to control sample introduction, plasma gas flows and pressures, detector parameters, etc. The processor typically is electrically coupled to a power source which can, for example, be a direct current source, an alternating current source, a battery, a fuel cell or other power sources or combinations of power sources. The power source can be shared by the other components of the system. The system may also include one or more input devices, for example, a keyboard, mouse, trackball, microphone, touch screen, manual switch (e.g., override switch) and one or more output devices, for example, a printing device, display screen, speaker. In addition, the system may contain one or more communication interfaces that connect the computer system to a communication network (in addition or as an alternative to the interconnection device). The system may also include suitable circuitry to convert signals received from the various electrical devices present in the systems. Such circuitry can be present on a printed circuit board or may be present on a separate board or device that is electrically coupled to the printed circuit board through a suitable interface, e.g., a serial ATA interface, ISA interface, PCI interface or the like or through one or more wireless interfaces, e.g., Bluetooth, Wi-Fi, Near Field Communication or other wireless protocols and/or interfaces.

In certain embodiments, the storage system used in the systems described herein typically includes a computer readable and writeable nonvolatile recording medium in which codes of software can be stored that can be used by a program to be executed by the processor or information stored on or in the medium to be processed by the program. The medium may, for example, be a hard disk, solid state drive or flash memory. The program or instructions to be executed by the processor may be located locally or remotely and can be retrieved by the processor by way of an interconnection mechanism, a communication network or other means as desired. Typically, in operation, the processor causes data to be read from the nonvolatile recording medium into another memory that allows for faster access to the information by the processor than does the medium. This memory is typically a volatile, random access memory such as a dynamic random access memory (DRAM) or static memory (SRAM). It may be located in the storage system or in the memory system. The processor generally manipulates the data within the integrated circuit memory and then copies the data to the medium after processing is completed. A variety of mechanisms are known for managing data movement between the medium and the integrated circuit memory element and the technology is not limited thereto. The technology is also not limited to a particular memory system or storage system. In certain embodiments, the system may also include specially-programmed, special-purpose hardware, for example, an application-specific integrated circuit (ASIC) or a field programmable gate array (FPGA). Aspects of the technology may be implemented in software, hardware or firmware, or any combination thereof. Further, such methods, acts, systems, system elements and components thereof may be implemented as part of the systems described above or as an independent component. Although specific systems are described by way of example as one type of system upon which various aspects of the technology may be practiced, it should be appreciated that aspects are not limited to being implemented on the described system. Various aspects may be practiced on one or more systems having a different architecture or components. The system may comprise a general-purpose computer system that is programmable using a high-level computer programming language. The systems may be also implemented using specially programmed, special purpose hardware. In the systems, the processor is typically a commercially available processor such as the well-known Pentium class processors available from the Intel Corporation. Many other processors are also commercially available. Such a processor usually executes an operating system which may be, for example, the Windows 95, Windows 98, Windows NT, Windows 2000 (Windows ME), Windows XP, Windows Vista, Windows 7, Windows 8 or Windows 10 operating systems available from the Microsoft Corporation, MAC OS X, e.g., Snow Leopard, Lion, Mountain Lion or other versions available from Apple, the Solaris operating system available from Sun Microsystems, or UNIX or Linux operating systems available from various sources. Many other operating systems may be used, and in certain embodiments a simple set of commands or instructions may function as the operating system. Further, the processor can be designed as a quantum processor designed to perform one or more functions using one or more qubits.

In certain examples, the processor and operating system may together define a platform for which application programs in high-level programming languages may be written. It should be understood that the technology is not limited to a particular system platform, processor, operating system, or network. Also, it should be apparent to those skilled in the art, given the benefit of this disclosure, that the present technology is not limited to a specific programming language or computer system. Further, it should be appreciated that other appropriate programming languages and other appropriate systems could also be used. In certain examples, the hardware or software can be configured to implement cognitive architecture, neural networks or other suitable implementations. If desired, one or more portions of the computer system may be distributed across one or more computer systems coupled to a communications network. These computer systems also may be general-purpose computer systems. For example, various aspects may be distributed among one or more computer systems configured to provide a service (e.g., servers) to one or more client computers, or to perform an overall task as part of a distributed system. For example, various aspects may be performed on a client-server or multi-tier system that includes components distributed among one or more server systems that perform various functions according to various embodiments. These components may be executable, intermediate (e.g., IL) or interpreted (e.g., Java) code which communicate over a communication network (e.g., the Internet) using a communication protocol (e.g., TCP/IP). It should also be appreciated that the technology is not limited to executing on any particular system or group of systems. Also, it should be appreciated that the technology is not limited to any particular distributed architecture, network, or communication protocol.

In some instances, various embodiments may be programmed using an object-oriented programming language, such as, for example, SQL, SmallTalk, Basic, Java, Javascript, PHP, C++, Ada, Python, iOS/Swift, Ruby on Rails or C# (C-Sharp). Other object-oriented programming languages may also be used. Alternatively, functional, scripting, and/or logical programming languages may be used. Various configurations may be implemented in a non-programmed environment (e.g., documents created in HTML, XML or other format that, when viewed in a window of a browser program, render aspects of a graphical-user interface (GUI) or perform other functions). Certain configurations may be implemented as programmed or non-programmed elements, or any combination thereof. In some instances, the systems may comprise a remote interface such as those present on a mobile device, tablet, laptop computer or other portable devices which can communicate through a wired or wireless interface and permit operation of the systems remotely as desired.

In certain examples, the processor may also comprise or have access to a database of information about molecules, their fragmentation patterns, and the like, which can include molecular weights, mass-to-charge ratios and other common information. The instructions stored in the memory can execute a software module or control routine for the system, which in effect can provide a controllable model of the system. The processor can use information accessed from the database together with one or software modules executed in the processor to determine control parameters or values for different components of the systems, e.g., different plasma gas flow rates, different electrode voltages, different mass analyzer parameters, etc. Using input interfaces to receive control instructions and output interfaces linked to different system components in the system, the processor can perform active control over the system. For example, the processor can control the detection device, sample introduction devices, discharge chambers, electrodes and other components of the system.

In certain embodiments, the discharge chambers can be used in a method that includes ionizing an analyte by introducing the analyte into a plasma discharge sustained within a discharge chamber comprising a first electrode. The discharge chamber may be configured similarly to any of those described herein, e.g., one that comprises at least one inlet and at least one outlet. The plasma discharge can be sustained within the discharge chamber by providing a voltage to the first electrode in the presence of a plasma gas introduced into the discharge chamber through the at least one inlet of the discharge chamber. For example, a direct current voltage of about 10 Volts to about 5000 Volts provided to the first electrode can be used to sustain the plasma discharge within the discharge chamber. An alternating current voltage of about 20 Volts to about 3000 Volts provided to the first electrode can be used to sustain the plasma discharge within the discharge chamber. A radio frequency current can be provided to the first electrode in a radio frequency range of about 100 Hz to about 10 MHz to sustain the plasma discharge within the discharge chamber. The exact gas pressure used can vary and illustrative pressures include, but are not limited to, those which can sustain the plasma discharge within the discharge chamber at a suitable pressure to avoid extinguishing of the plasma discharge. In one non-limiting illustration, a pressure of about $10^{-3}$-100 Torr can be used. In another non-limiting example, a plasma gas flow rate of 500 sccm or less can be used to sustain the plasma discharge. As noted herein the discharge tube can be configured in many different manners and may comprise a first section adjacent to the at least one inlet, a third section adjacent to the at least one outlet and a second section between the first section and the third section. If desired, an average inner diameter of the third section is larger than an average inner diameter of the second section.

In some examples, the parameters used to sustain the plasma discharge can be selected to promote production of a parent analyte ion of the ionized analyte to permit quantitation of the analyte using a parent analyte ion mass-to-charge peak intensity. For example, the softer ionization provided by the plasma discharge can be used to increase an amount of precursor ions which are produced as compared to an amount of precursor ions produced using, for example, electron ionization. A current provided to the first electrode can be monitored to determine if the plasma discharge is sustained within the discharge chamber. As noted herein, two or more plasma gases, two or more chambers or two or more different voltages can be used to sustain the plasma discharge. The parameters may be altered between different analytes to provide for selective ionization of different analytes.

In some embodiments, a method comprises providing a discharge chamber configured to sustain a plasma discharge within the discharge chamber. The discharge chamber can be configured to electrically couple to at least one electrode configured to couple to a power source. The discharge chamber may comprise at least one inlet, at least one outlet and at least one optional bend between the at least one inlet and the at least one outlet. The discharge chamber can be configured to sustain the plasma discharge within the discharge chamber using a voltage provided to the at least one electrode.

In some examples, a method of quantitating an analyte in a sample comprises measuring a peak intensity of a parent analyte ion produced from ionization of the analyte after introducing the analyte into a plasma discharge produced within a discharge chamber by using any suitable plasma gas flow rate such as, for example, a plasma gas flow rate of 500 sccm or less in one illustration, wherein the plasma gas is selected to enhance production of the parent analyte ion using the produced plasma discharge.

In other examples, a method of ionizing of an analyte to enhance production of a parent analyte ion comprises introducing the analyte into a plasma discharge sustained in a discharge chamber using a plasma gas provided to the discharge chamber and a voltage provided to the discharge chamber, wherein the plasma discharge is sustained within the discharge chamber using any suitable plasma gas flow rate such as, for example, a plasma gas flow of 500 sccm or less, and wherein the plasma discharge comprises an average temperature of about 2000 Kelvin or less.

In some examples, a plasma discharge comprises an average temperature of about 2000 Kelvin or less, wherein the plasma discharge is sustained within a discharge chamber using a voltage provided to the discharge chamber in the presence of a provided plasma gas at a plasma gas flow rate of 500 sccm or less.

In certain examples, the discharge chambers may be packed in a kit with instructions for using for using the plasma discharge ionization source to provide a plasma discharge within the discharge chamber. For example, the instructions may permit an end user to retrofit an existing instrument with the discharge chamber.

Certain specific examples are now described to illustrate further some of the novel aspects and features of the technology described herein.

Example 1

Figure 11:
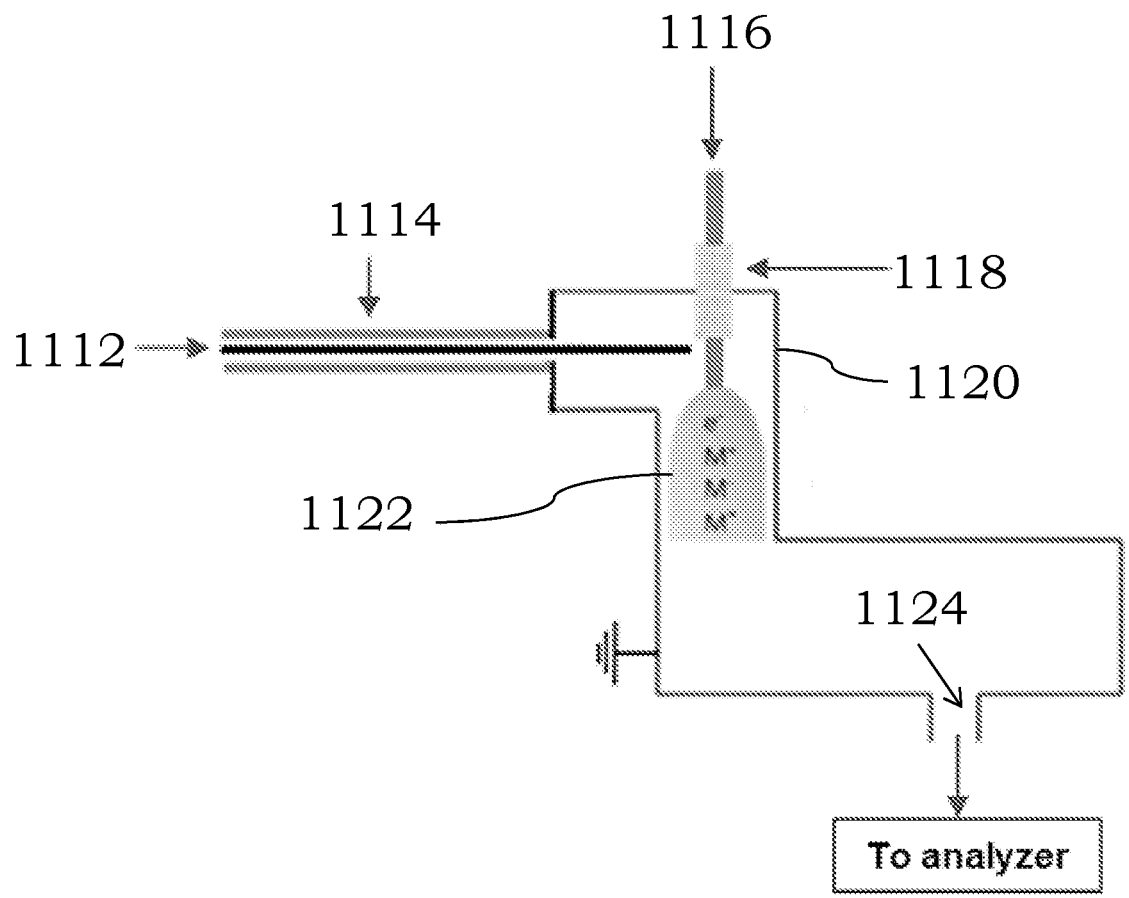
FIG. 11 is an illustration of a discharge chamber, in accordance with some examples.

Referring to FIG. 11, an illustration is shown of a discharge chamber comprising a stainless steel chamber 1120. A gas chromatography (GC) inlet 1112 is fluidically coupled to a fluid transfer line 1114 to transfer analyte from the GC system to chamber 1120. A plasma gas enters the chamber in the direction of arrow 1116. A probe comprising an electrode 1118 is electrically coupled to a DC power source to provide a voltage to the electrode. Using the plasma gas and the electrode 1118 a plasma discharge 1122 can be sustained in the chamber 1120. The analyte species from the GC can be ionized and may exit the chamber 1120 through an outlet 1124 and be provided to a downstream mass analyzer.

Example 2

Figure 12:
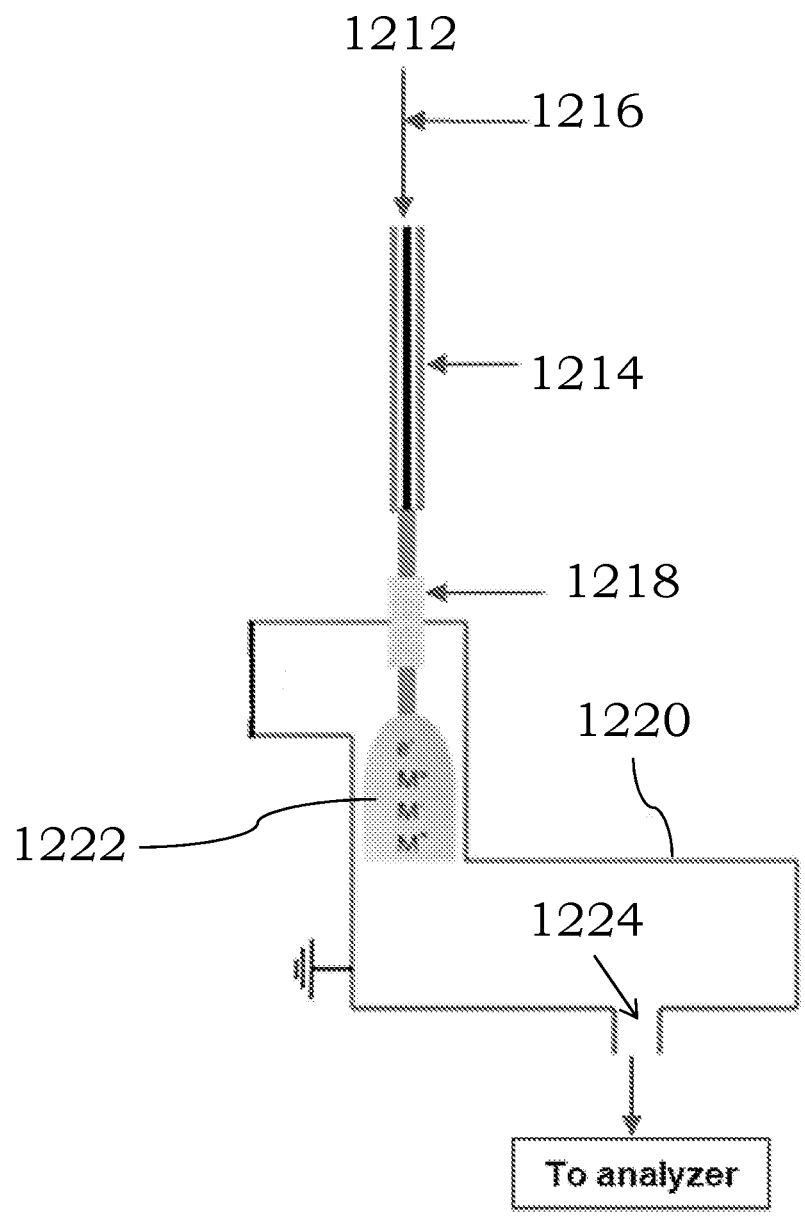
FIG. 12 is another illustration of a discharge chamber, in accordance with some examples.

Referring to FIG. 12, an illustration is shown of a discharge chamber comprising a stainless steel chamber 1220. A gas chromatography (GC) inlet 1212 is fluidically coupled to a fluid transfer line 1214 to transfer analyte from the GC system to chamber 1220. A plasma gas enters the chamber in the direction of arrow 1216 and passes through the fluid transfer line 1214 into the chamber 1220. A probe comprising an electrode 1218 is electrically coupled to a DC power source to provide a voltage to the electrode. Using the plasma gas and the electrode 1218 a plasma discharge 1222 can be sustained in the chamber 1220. The analyte species from the GC can be ionized and may exit the chamber 1220 through an outlet 1224 and be provided to a downstream mass analyzer.

Example 3

Different plasma gases can be selected based on their ionization potential. Table 1 shows some values for different plasma gases. In table 1, E* represents energy of meta-stables, $t_{rad}$ represents radiative lifetime and $E^i$ represents ionization energy (of atomic or molecular species).

TABLE 1

| Gas | E* (eV) | $t_{rad}$ (seconds) | $E^i$ (eV) |
|---|---|---|---|
| He | 19.82 | 7900 | 24.6 |
| Ne | 16.61 | 430 | 21.6 |
| Ar | 11.55 | 45 | 15.76 |
| Kr | 9.92 | 85 | 14.0 |
| Xe | 8.32 | 150 | 12.13 |
| $N_2$ | 8.52 | 0.7 | 15.6 |
| NO | 4.7 | 0.2 | 9.26 |

Example 4

Figure 13:
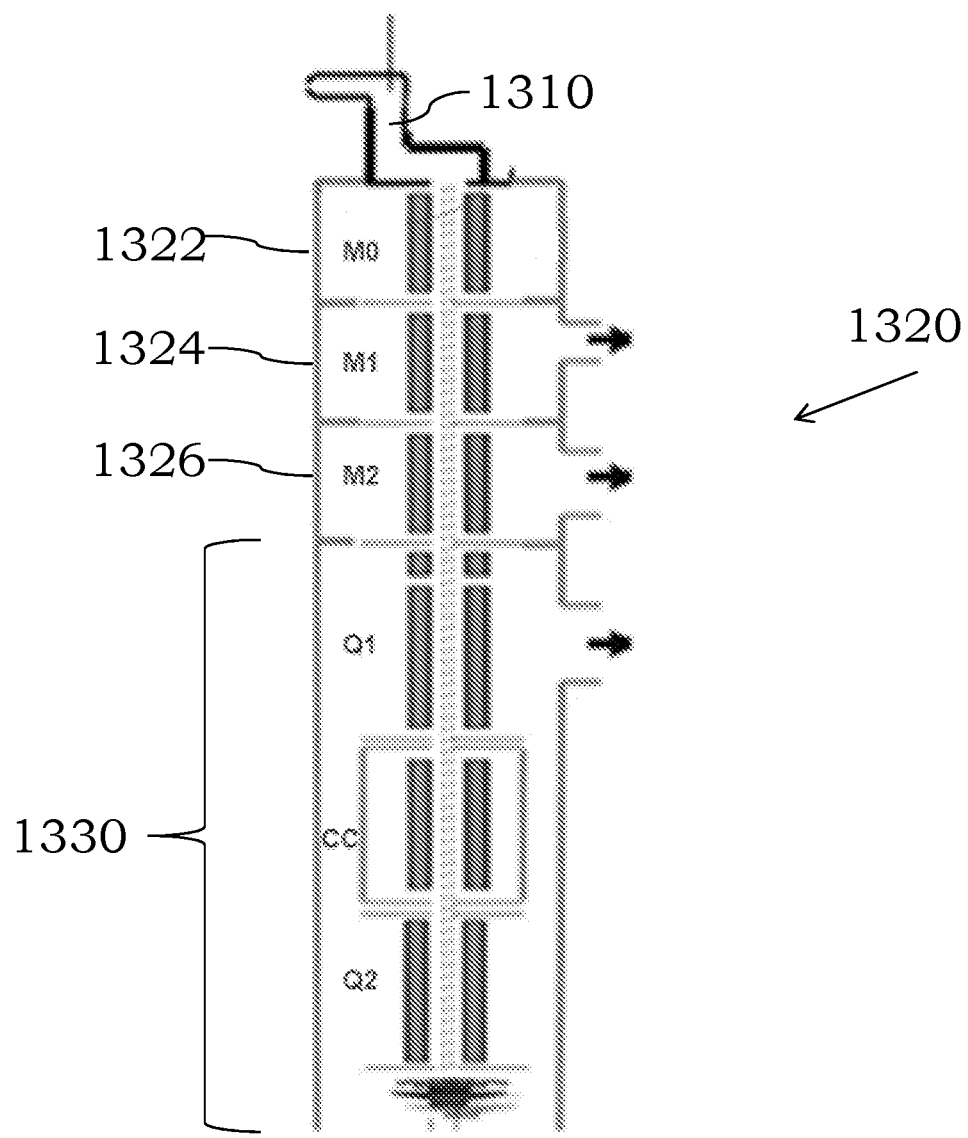
FIG. 13 is an illustration of a discharge chamber fluidically coupled to a triple quadrupole assembly, in accordance with some embodiments.

Referring to FIG. 13, an illustration is shown of a discharge chamber 1310 directly coupled to an inlet of a mass analyzer 1320. An outlet of the discharge chamber 1310 is directly coupled to an inlet of a first pumping stage 1322 to fluidically couple the outlet and the first pumping stage 1322 (labeled as M0). The first pumping stage 1322 is fluidically coupled to a second pumping stage 1324 (labeled as M1), and the second pumping stage 1324 is fluidically coupled to a third pumping stage 1326 (labeled as M2). Each of the pumping stages can be fluidically coupled to one or more pumps (as shown by the arrows in FIG. 13) to reduce the pressure within the various pumping stages, though stage 1322 (labeled as M0) may not be fluidically coupled to any pumps if desired. The third pumping stage 1326 is fluidically coupled to a triple quadrupole assembly 1330 that comprises a first quadrupole Q1, a second quadrupole CC and a third quadrupole Q2. The second quadrupole CC can be configured as a collision quadrupole, and the first quadrupole Q1 and the third quadrupole Q2 can be configured to select ions from an incident ion beam. A detector (not shown) can be fluidically coupled to Q2 to receive the selected ions and determine how many ions are present. The mass analyzer 1330 need not include all stages or components shown in FIG. 13.

Example 5

Figure 14:
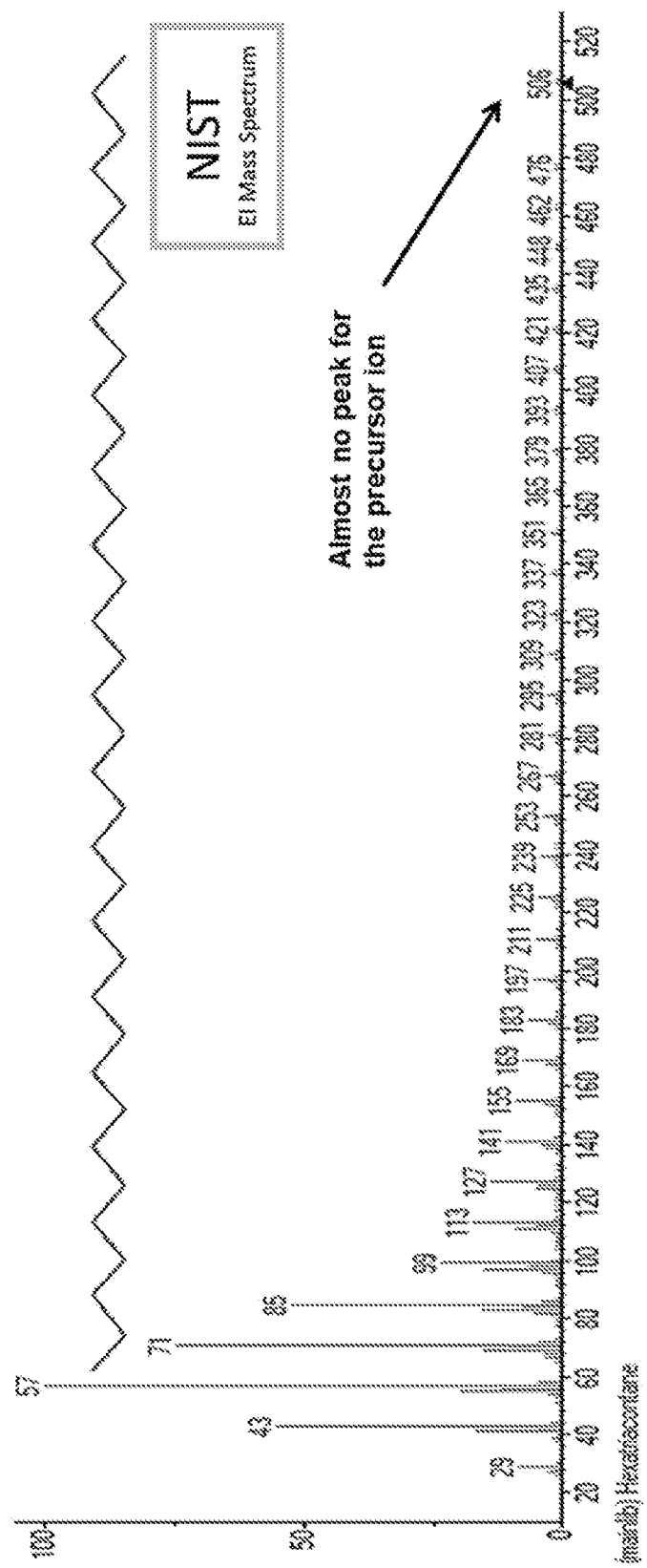
FIG. 14 is mass spectrum that can be obtained using electron ionization and showing little precursor ion, in accordance with some examples.
Figure 17:
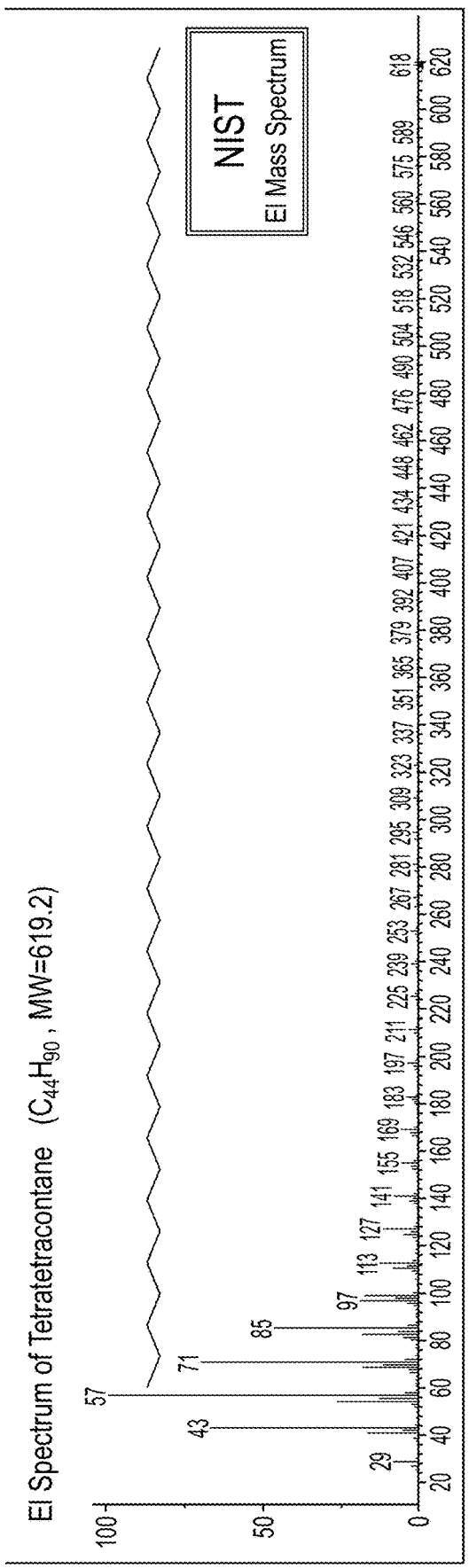

FIG. 14 shows a mass spectrum for hexatriacontane ($C_{36}H_{74}$ MW=506.9) using electron ionization. No precursor ions are present in the mass spectrum, which makes identification of this analyte only possible using the fragment ions. FIGS. 15-17 show spectra for hexatriacontane (FIG. 15), tetracontane (FIG. 16) and tetratetracontane (FIG. 17) using electron ionization methods. All major fragments in the mass spectra are those of hydrocarbons, which makes identification of the various species difficult.

Example 6

Figure 18:
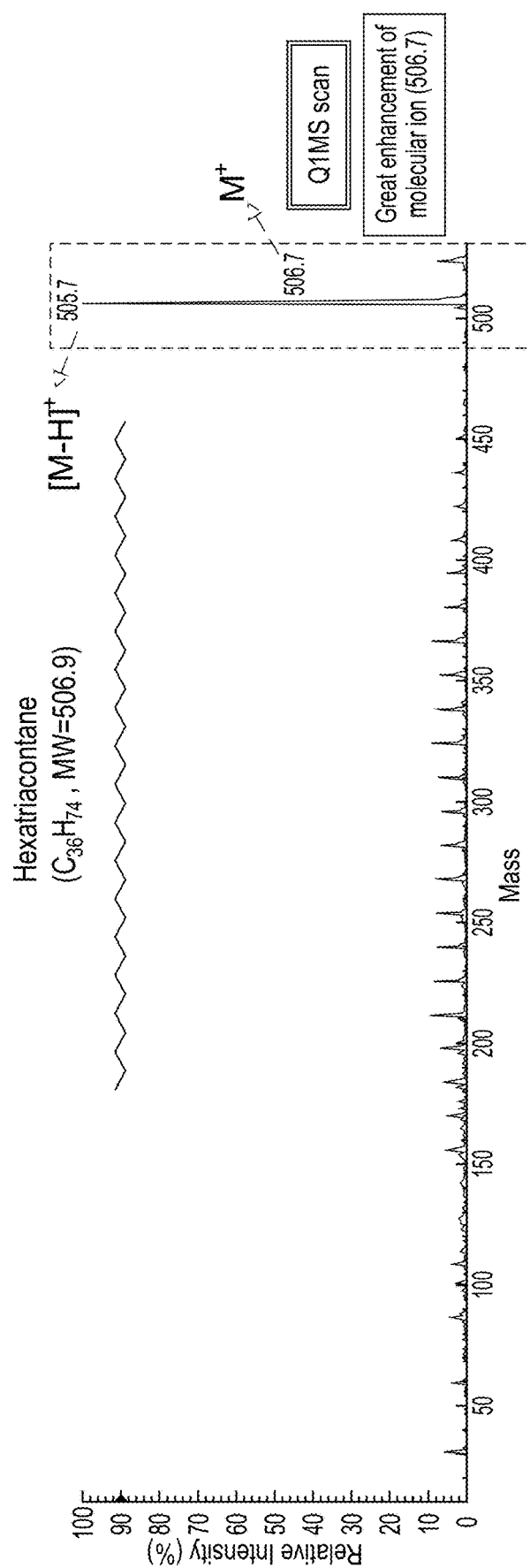
FIG. 18 and FIG. 19 show mass spectra obtained using the discharge chambers described herein.
Figures 19, 20:
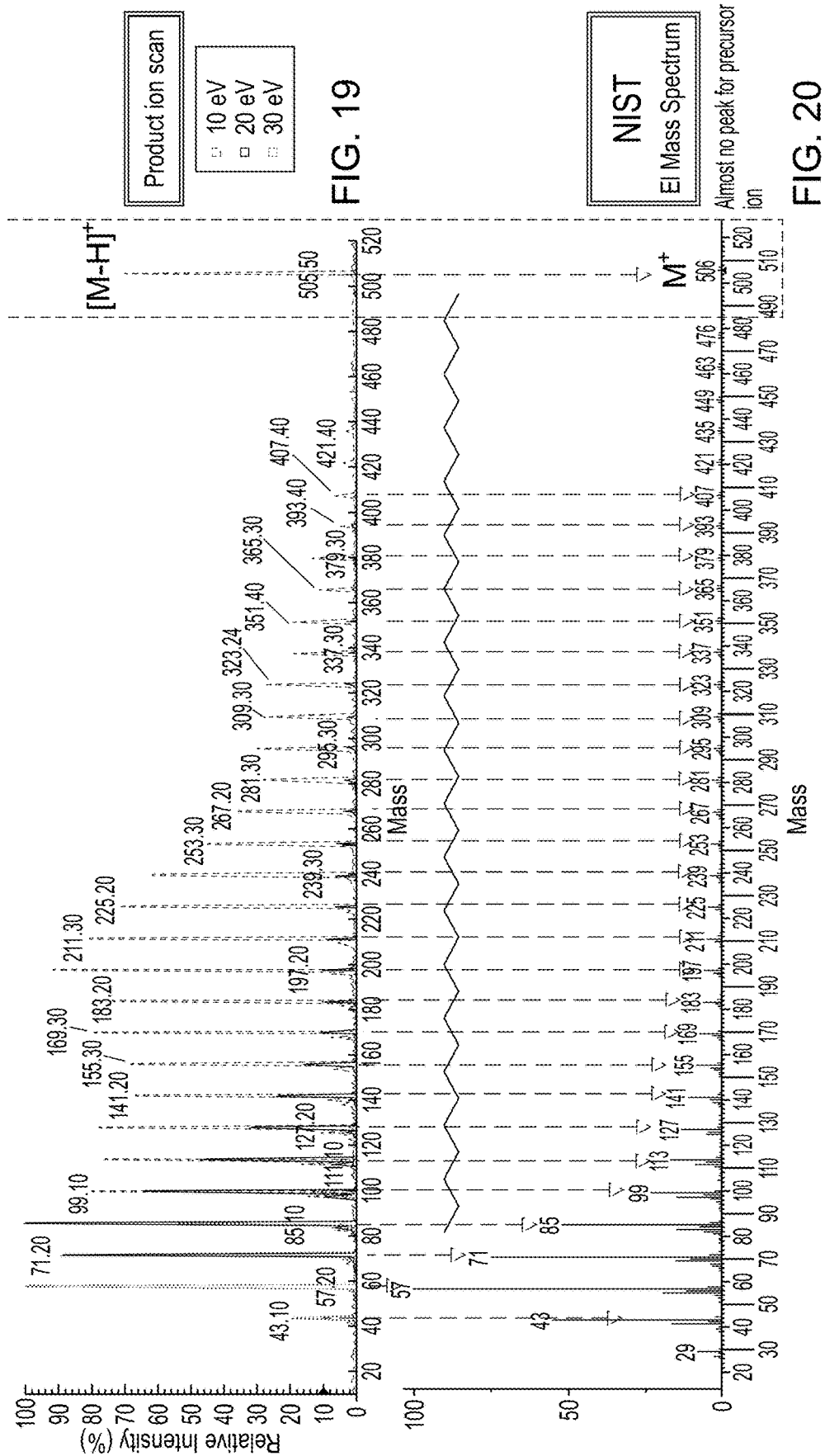
FIG. 20 shows the same spectrum as FIG. 14 for comparison purposes.

Mass spectra were obtained for hexatriacontane ($C_{36}H_{74}$ MW=506.9) using the discharge tube and mass analyzer setup shown in FIG. 13. The voltage provided to sustain the discharge was about −500 Volts. In the scan of FIG. 19, argon was used as the plasma gas at a flow rate of about 50 sccm. Zero air was used in the scan of FIG. 18 and FIG. 19. Argon was used as a collision gas to obtain the scan shown in FIG. 20. The results are shown in FIGS. 18 and 19. FIG. 20 includes an electron ionization scan for comparison.

Referring to FIG. 18, a Q1MS full scan shows enhanced production of precursor ion ($M^+$ and/or $[M-H]^+$), whereas almost no precursor ion is observed when conventional EI is used (FIG. 20). A product ion scan (FIG. 19) also shows that large amounts of the precursor ion are present. By enhancing precursor ion amounts, it is possible to use the precursor ion to identify and/or quantify an amount of the molecule in a sample.

When introducing elements of the examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples can be interchanged or substituted with various components in other examples.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. A method comprising ionizing an analyte by:
introducing the analyte into a plasma discharge sustained within a discharge chamber comprising a first electrode configured to couple to a power source, wherein the discharge chamber comprises at least one inlet to receive a plasma gas and at least one outlet to provide ionized analyte from the discharge chamber, wherein the at least one inlet is coupled to the at least one outlet through a bend to remove interfering species from the ionized analyte, wherein the at least one inlet is present in a first region of the discharge chamber and the at least one outlet is outside the first region of the discharge chamber, and wherein the plasma discharge is sustained within the discharge chamber by providing a voltage to the first electrode in the presence of a plasma gas introduced into the discharge chamber through the at least one inlet of the discharge chamber, wherein the introduced analyte is ionized using a first plasma gas; and
permitting the ionized analyte to exit the discharge chamber through the at least one outlet prior to introduction of a second analyte into the discharge chamber.

2. The method of claim 1, further comprising introducing the second analyte into the discharge chamber to ionize the introduced second analyte using a second plasma gas different from the first plasma gas.

3. The method of claim 1, further comprising ionizing the introduced analyte using a first voltage provided to the first electrode, and, after permitting exit of the ionized analyte from the discharge chamber, introducing the second analyte into the discharge chamber to ionize the introduced second analyte using a second voltage provided to the first electrode, wherein the second voltage is different from the first voltage.

4. The method of claim 1, further comprising coupling the discharge chamber to a second discharge chamber, wherein the second discharge chamber is electrically coupled to a second electrode, wherein the second discharge chamber comprises at least one inlet, and at least one outlet, and wherein a plasma discharge is sustained within the second discharge chamber by providing a voltage to the second electrode in the presence of a plasma gas.

5. The method of claim 4, further comprising configuring the second discharge chamber with at least one bend between the at least one inlet of the second discharge chamber and the at least one outlet of the second discharge chamber.

6. The method of claim 1, further comprising sustaining the plasma discharge in the discharge chamber without any inductive coupling.

7. An ionization source comprising:
a first discharge chamber configured to receive a sample from a sample introduction device, the first discharge chamber comprising:
a first electrode,
at least one inlet to receive a plasma gas, and
at least one outlet to provide ionized analyte from the first discharge chamber,
wherein the at least one inlet is present in a first region of the first discharge chamber and the at least one outlet is outside the first region of the first discharge chamber, and wherein the first discharge chamber is configured to sustain a first plasma discharge in the presence of a plasma gas introduced into the first discharge chamber through the at least one inlet of the first discharge chamber; and
a second discharge chamber arranged parallel to the first discharge chamber and configured to receive the sample from the sample introduction device, the second discharge chamber comprising:
a second electrode,
at least one inlet to receive a plasma gas, and
at least one outlet to provide ionized analyte from the second discharge chamber,
wherein the at least one inlet of the second discharge chamber is present in a first region of the second discharge chamber and the at least one outlet is outside the first region of the second discharge chamber, and wherein the second discharge chamber is configured to sustain a second plasma discharge in the presence of a plasma gas introduced into the second discharge chamber.

8. The ionization source of claim 7, wherein the first discharge chamber is a straight chamber.

9. The ionization source of claim 8, wherein the at least one inlet of the second discharge chamber is coupled to the at least one outlet of the second discharge chamber through a bend.

10. The ionization source of claim 7, wherein the at least one inlet of the first discharge chamber is coupled to the at least one outlet of the first discharge chamber through a bend.

11. The ionization source of claim 10, wherein the first discharge chamber further comprises a second region coupled to the first region and a third region coupled to the second region, wherein the at least one outlet of the first discharge chamber is in the third region and the bend is in the second region.

12. The ionization source of claim 10, wherein the at least one inlet of the second discharge chamber is coupled to the at least one outlet of the second discharge chamber through a bend.

13. The ionization source of claim 12, wherein the second discharge chamber further comprises a second region coupled to the first region and a third region coupled to the second region, wherein the at least one outlet of the second discharge chamber is in the third region and the bend is in the second region.

14. The ionization source of claim 12, wherein the bend of the second discharge chamber comprises a different shape than the bend of the first discharge chamber.

15. The ionization source of claim 7, wherein the first electrode is positioned within the at least one inlet of the first discharge chamber.

16. The ionization source of claim 15, wherein the second electrode is positioned within the at least one inlet of the second discharge chamber.

17. The ionization source of claim 7, wherein the first discharge chamber and the second discharge chamber are configured to receive a first plasma gas.

18. The ionization source of claim 7, wherein the first discharge chamber and the second discharge chamber are configured to receive a different plasma gas.

19. The ionization source of claim 7, further comprising a valve configured to switch flow of the sample between the first discharge chamber and the second discharge chamber.

20. The ionization source of claim 7, further comprising a valve configured to provide flow of the sample to both of the first discharge chamber and the second discharge chamber.

* * * * *